(12) United States Patent
Lee et al.

(10) Patent No.: US 7,421,557 B2
(45) Date of Patent: Sep. 2, 2008

(54) METHOD AND DEVICE FOR PERFORMING CACHE READING

(75) Inventors: Jin-Yub Lee, Seoul (KR); Sang-Won Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 407 days.

(21) Appl. No.: 10/999,174

(22) Filed: Nov. 30, 2004

(65) Prior Publication Data

US 2005/0226046 A1    Oct. 13, 2005

(30) Foreign Application Priority Data

Mar. 30, 2004    (KR)    ............... 10-2004-0021654

(51) Int. Cl.
*G06F 13/00* (2006.01)
(52) U.S. Cl. ............... 711/167; 711/168; 711/169; 365/189.04; 365/189.05
(58) Field of Classification Search ............... None
See application file for complete search history.

(56) References Cited

U.S. PATENT DOCUMENTS

| | | | |
|---|---|---|---|
| 5,822,245 A | 10/1998 | Gupta et al. | |
| 6,434,042 B1 | 8/2002 | Lee et al. | |
| 6,717,857 B2 | 4/2004 | Byeon et al. | |
| 6,871,257 B2 * | 3/2005 | Conley et al. | ............... 711/103 |
| 2003/0076719 A1 | 4/2003 | Byeon et al. | |
| 2003/0117856 A1 | 6/2003 | Lee et al. | |
| 2003/0174539 A1 | 9/2003 | Byeon et al. | |
| 2003/0202383 A1 | 10/2003 | Shiota et al. | |

FOREIGN PATENT DOCUMENTS

| | | |
|---|---|---|
| JP | 11-145429 | 5/1999 |
| JP | 11-154393 | 6/1999 |
| JP | 2002-43444 | 2/2002 |
| KR | 2003-0033679 | 5/2003 |

* cited by examiner

*Primary Examiner*—Jasmine Song
(74) *Attorney, Agent, or Firm*—Harness, Dickey & Pierce, P.L.C.

(57) ABSTRACT

Method and device for reading data from a semiconductor device, where tR is a read operation time, tT is a buffer transfer time, and tH is a host transfer time, where at least two of tR, tT, and tH may be overlapped to reduce a total transfer time.

28 Claims, 23 Drawing Sheets

① B/L discharge & PGbuf reset
② Sensing
③ Latch & Data Out
④ Reset or Recovery

① PGbuf reset & B/L discharge
② B/L Precharge
③ Sensing
④ Data Latch
⑤ Reset or Recovery
⑥ Data out

Fig. 14A

| Register Address | Meaning | Default Value |
| --- | --- | --- |
| F000h | Device ID Register | 0001h |
| F001h | Flash Block Address Register | 0000h |
| F002h | Flash Page Address Register | 0000h |
| F003h | Buffer Select Register | 0000h |
| F004h | Command Register | 0000h |

Fig. 14B

| Command | Command Meaning |
| --- | --- |
| 0000h | Flash Read Command |
| 0001h | Flash Cache Read Command1 |
| 0002h | Flash Cache Read Command2 |
| 0003h | Flash Write Command |
| 0004h | Flash Erase Command |
| 0005h | Flash Reset Command |

METHOD AND DEVICE FOR PERFORMING CACHE READING

PRIORITY STATEMENT

This application claims the benefit under 35 U.S.C. § 119 (a) of Korean Patent Application No. 2004-21654 filed on Mar. 30, 2004, the contents of which are hereby incorporated by reference in their entirety.

BACKGROUND OF THE INVENTION

Recent developments in memory applications, such as mass storage, code memory, and other multimedia applications increasingly require memory devices with higher density. Mass storage applications may include memory cards (for example, for mobile computers), solid-state memory (for example, sturdy and/or reliable storage disks), digital cameras (for recording still or moving images and sound), and voice or audio recorders for recording near CD quality sound).

Code memory applications may include basic input/output systems (BIOS) or network applications (for example, memory in a personal computer, other terminal, router, or hub), telecommunications applications (for example, switches), mobile phone applications (for example, codes and/or data), and other electronic handheld information device applications (for example, codes and/or data for personal digital assistants (PDA), palm operating systems (POS), or personal communications assistants (PCA)).

Generally, mass storage applications use memory that is lower cost, higher density, and/or has better program/erase (P/E) cycling endurance, while code memory applications have faster random access and/or are executable in place (XIP).

Related art memories may include dynamic random access memory (DRAM), static random access memory (SRAM), and non-volatile memory (NVM). Non-volatile memory may include mask read only memory (ROM), erasable programmable read only memory (EPROM), electrically erasable programmable read only memory (EEPROM), flash memory (for example, flash erase EEPROM), and ferro-electric memory. Non-volatile memory does not lose data when power is lost, but generally does not permit random access and is generally slower than volatile memory.

Flash memory may be formed by a combination of erasable programmable read only memory (EPROM) and electrically erasable programmable read only memory (EEPROM). Flash memory may be NAND or NOR flash memory. Erase and program operations may be performed in a flash memory by the application of different voltages to each flash memory cell.

Generally, NAND flash memory is more conducive to mass storage applications due to smaller cell size, higher density, lower power and/or better endurance, while NOR flash memory is more conducive to code storage applications due to larger cell current and/or faster random access.

NAND flash memory may include a string of serially connected cells (for example, 16 cells may make up a string). The string may include one or mroe string select transistors. NAND flash memory may have a relatively small "on" cell current and hence, relatively slow sensing time (for example, 5-10 ms). NAND flash memory may perform a read operation by simultaneously sensing and latching a page unit (for example, 512 bytes) to page buffers. NAND flash memory may read data from page buffers latch at a relatively high speed (for example, 50 ns).

NAND flash memory may perform program and/or erase operations by tunneling (for example, Fowler-Nordheim (F-N) tunneling). A program operation may include a relatively fast serial data loading to page buffers (for example, 50 ns), where cells (for example, 512 bytes) are simultaneously programmed. An erase operation may be a block unit erase where a number of pages (for example, 32 pages of 16K bytes cells) are simultaneously erased.

Reliable F-N tunneling may be performed at approximately 10 mV/cm. which may result in lower power consumption, lower temperature dependence, more uniform program/erase operation, and/or easier device/voltage scaling.

NAND flash program operation may utilize a coupling between a gate and a channel. For example, a programmed cell may have a larger difference between the gate and the channel than an unprogrammed cell. NAND flash program operation also may also utilize a threshold voltage distribution, an example of which is shown in FIG. 1. FIG. 1 illustrates the relationship between a word line voltage $V_{word\ line}$, a read voltage $V_{read}$, and a cell voltage distribution Vth of an unprogrammed (or erased) cell and a programmed cell.

NAND flash memories may include page buffers for facilitating data transfers into and out of a NAND flash cell array. Page buffers generally may perform two functions, sensing and latching. An example of a related art page buffer is illustrated in FIG. 2. As shown, the example, related art page buffer may include a switching transistor, a load transistor for enabling a load current to flow to permit sensing, and a latch for latching the sense data, triggered by a latching enable signal.

FIGS. 3a and 3b illustrate an example, related art page buffer and an example of a read operation of the example, related art page buffer. As shown in FIG. 3b, the example, related art page buffer may operate in several periods, including a bit line (B/L) discharge period, a bit line (B/L) precharge period, a develop period, a sensing and latch period, and a reset (or recovery period).

FIGS. 4a and 4b illustrate another example, related art page buffer and another example of a read operation of the example, related art page buffer. As shown in FIG. 4b, the example, related art page buffer may also operate in several periods, including a bit line (B/L) discharge and page buffer reset period, a sensing period, a latch and data out period, and a reset (or recovery period).

FIGS. 5a and 5b illustrate yet another example, related art page buffer and yet another example of a read operation of the example, related art page buffer. As shown in FIG. 5b, the example, related art page buffer may also operate in several periods, including a page buffer reset and bit line (B/L) discharge period, a bit line (B/L) precharge period, a sensing period, a data latch period, a reset (or recovery period), and a data out period.

FIG. 6 illustrates the structure of an example, related art page buffer in more detail. As shown, the page buffer of FIG. 6 includes a precharge block, a bit line (B/L) selecting and bias block, a first and second latch and sense block, and a column gate circuit.

The page buffers of FIGS. 5a-6 may perform interleave operations, but also may be relatively complex structurally, have a relatively large layout area, and/or be relatively slow.

SUMMARY OF THE INVENTION

Example embodiments of the present invention are directed to semiconductor devices, such as semiconductor memory devices, including, for example, flash memory, with reduced data transfer time.

Example embodiments of the present invention are directed to programming methods with reduced data transfer time.

In example embodiments, the present invention is directed to a method and device for performing a cache operation, for example, a cache read operation.

In example embodiments, the present invention is directed to a method of reading M (where M is an integer >2) data from a semiconductor device, including transferring first data from a non-volatile memory cell array into page buffers, concurrently transferring the first data from the page buffers into a first of a pair of buffers and transferring second data from the non-volatile memory cell array into the page buffers, and concurrently transferring the first data from the first of the pair of buffers to a host, transferring the second data from the page buffer into the second of the pair of buffers, and transferring third data from the non-volatile memory cell array into the page buffers.

In example embodiments, the present invention is directed to a method of reading M (where M is an integer >2) data from a semiconductor device, including concurrently transferring first data from a first buffer to a host, transferring second data from page buffers into a second buffer, and reading third data from a non-volatile memory cell array into the page buffers.

In example embodiments, the present invention is directed to a semiconductor device, including a non-volatile memory cell array for storing M (where M is an integer >2) data, a plurality of page buffers, a pair of buffers, and a controller for controlling the non-volatile memory cell array, the page buffers, and the pair of buffers to transfer first data from a non-volatile memory cell array into the page buffers, concurrently transfer the first data from the page buffers into a first of a pair of buffers and read second data from the non-volatile memory cell array into the page buffers, and concurrently transfer the first data from the first of the pair of buffers to a host, transfer the second data from the page buffer into a second of the pair of buffers, and read third data from the non-volatile memory cell array into the page buffers.

In example embodiments, the present invention is directed to a method of reading M (where M is an integer >2) data from a semiconductor device including concurrently transferring first data from a first buffer to a host, transferring second data from page buffers into a second buffer, and reading third data from a non-volatile memory cell array into the page buffers.

In example embodiments, the present invention is directed to a semiconductor device including a controller for overlapping at least two of tR, tT, and tH to reduce a total transfer time between the semiconductor device and a host device, where tR is a read operation time, tT is a buffer transfer time, and tH is a host transfer time.

In example embodiments, the present invention is directed to a read method in a memory device including setting a bit line with data in a first memory cell and storing the data on the bit line in a register, where data in the register is transferred to a data bus while setting the bit line with data in a second memory cell.

In example embodiments, the present invention is directed to a read method in a memory device including initializing a bit line of a first memory cell, pre-charging the bit line with a pre-charge voltage, developing data in a memory cell on the bit line; initializing a register corresponding to the bit line, and storing the data on the bit line in the register, wherein the data in the register is output externally while performing the initializing, pre-charging, making and initializing to set the bit line with data in a second memory cell.

BRIEF DESCRIPTION OF THE DRAWINGS

The present invention will become more fully understood from the detailed description given below and the accompanying drawings, which are given for purposes of illustration only, and thus do not limit the invention.

FIG. 14a illustrates an address region of a memory cell array of a semiconductor memory device according to an example embodiment of the present invention.

FIG. 14b illustrates a register region of a memory cell array of a semiconductor memory device according to an example embodiment of the present invention.

Figure 1:
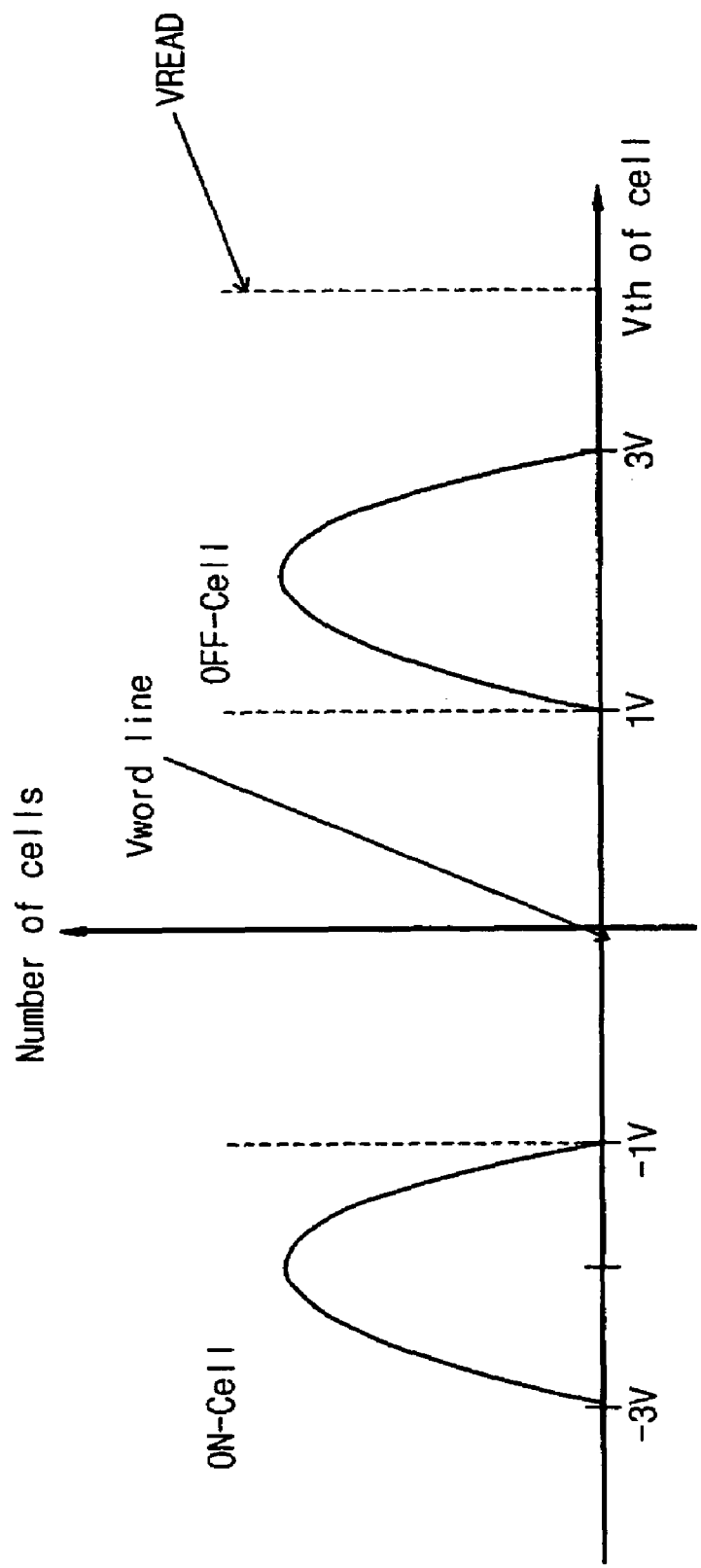
FIG. 1 illustrates a relationship between a word line voltage $V_{word\ line}$, a read voltage $V_{read}$, and a cell voltage distribution Vth of a unprogrammed (or erased) cell and a programmed cell.
Figure 2:
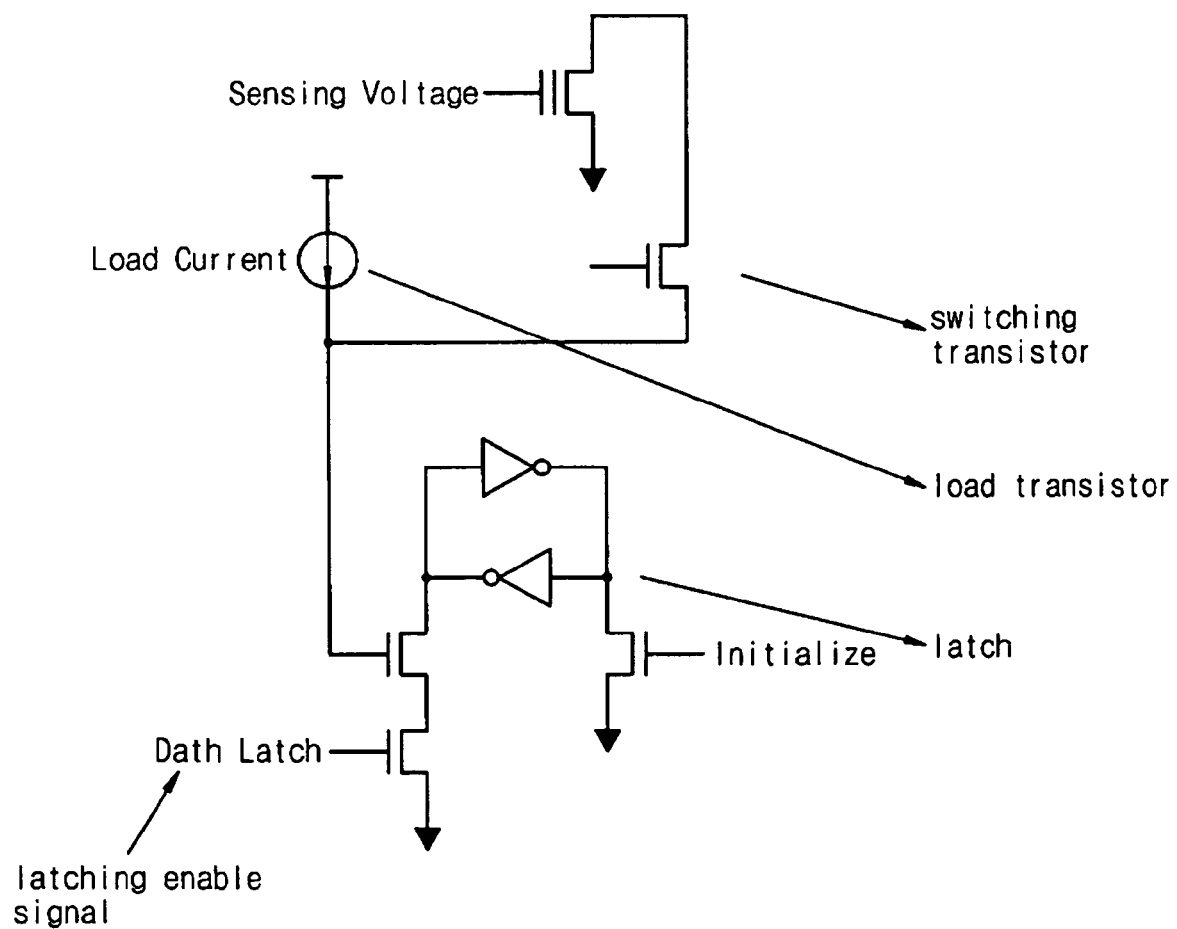
FIG. 2 illustrates an example, related art page buffer.
Figure 3A:
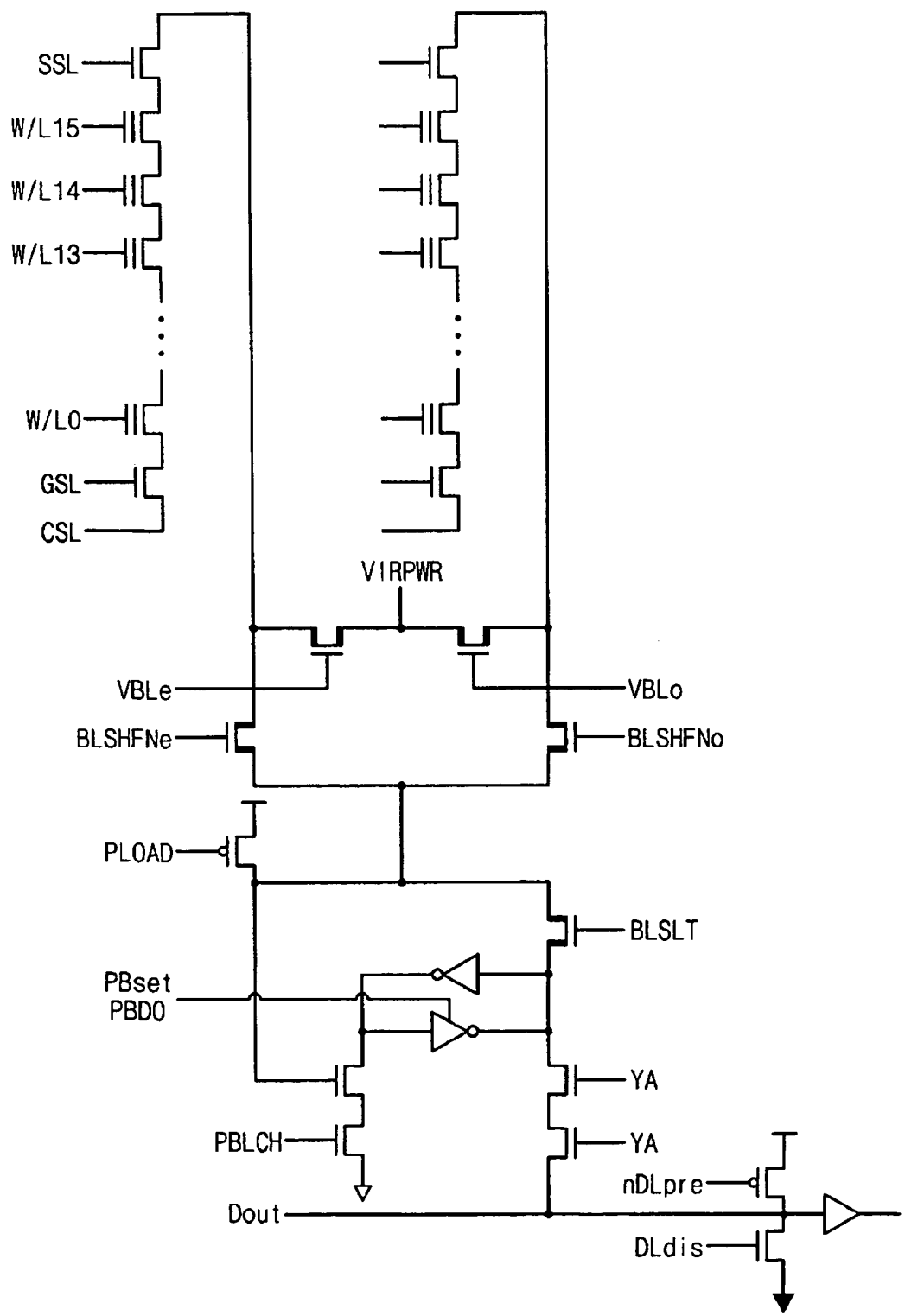
FIGS. 3a and 3b illustrate an example, related art page buffer and an example of a read operation of the example, related art page buffer.
Figure 3B:
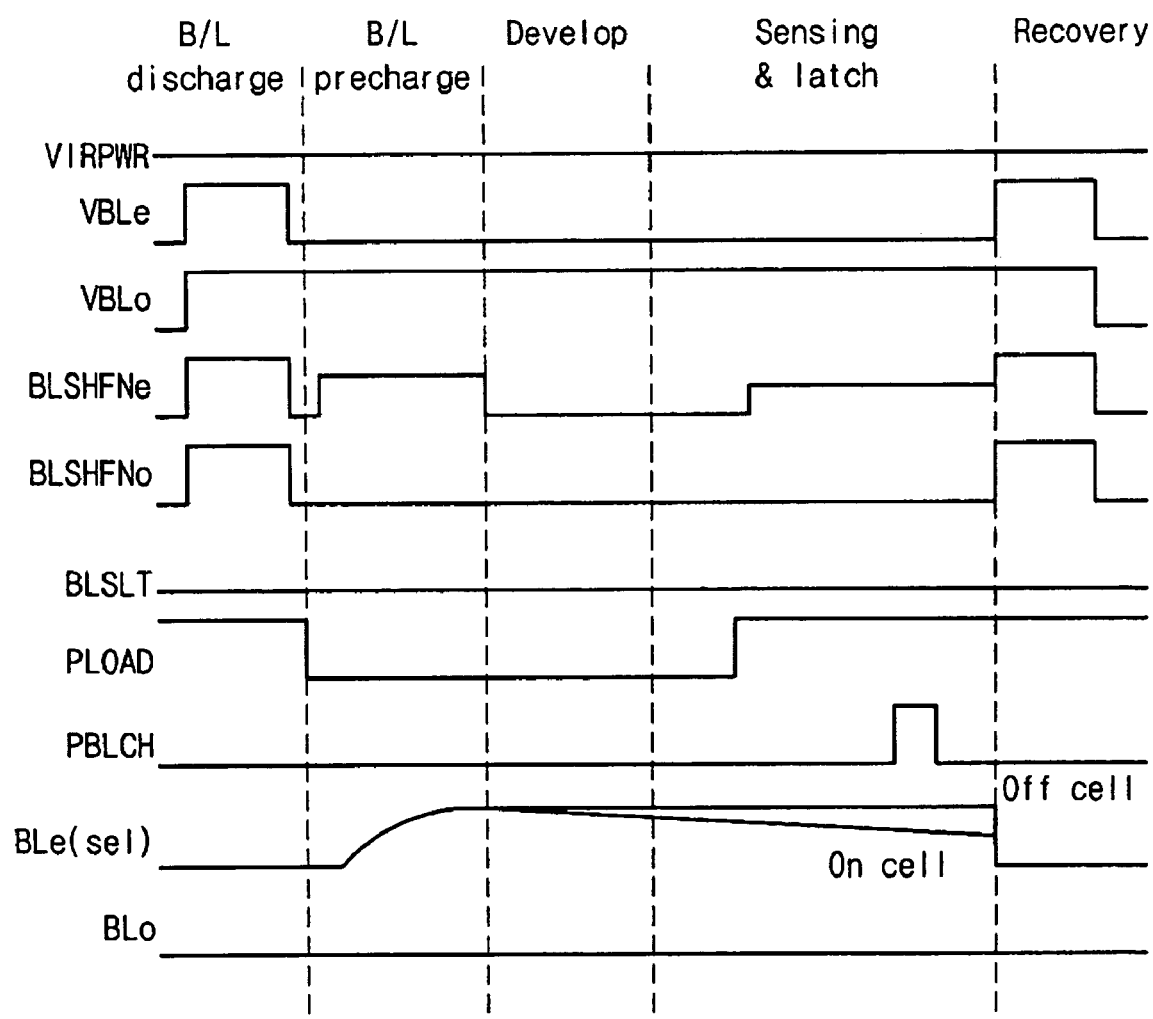
Figure 4A:
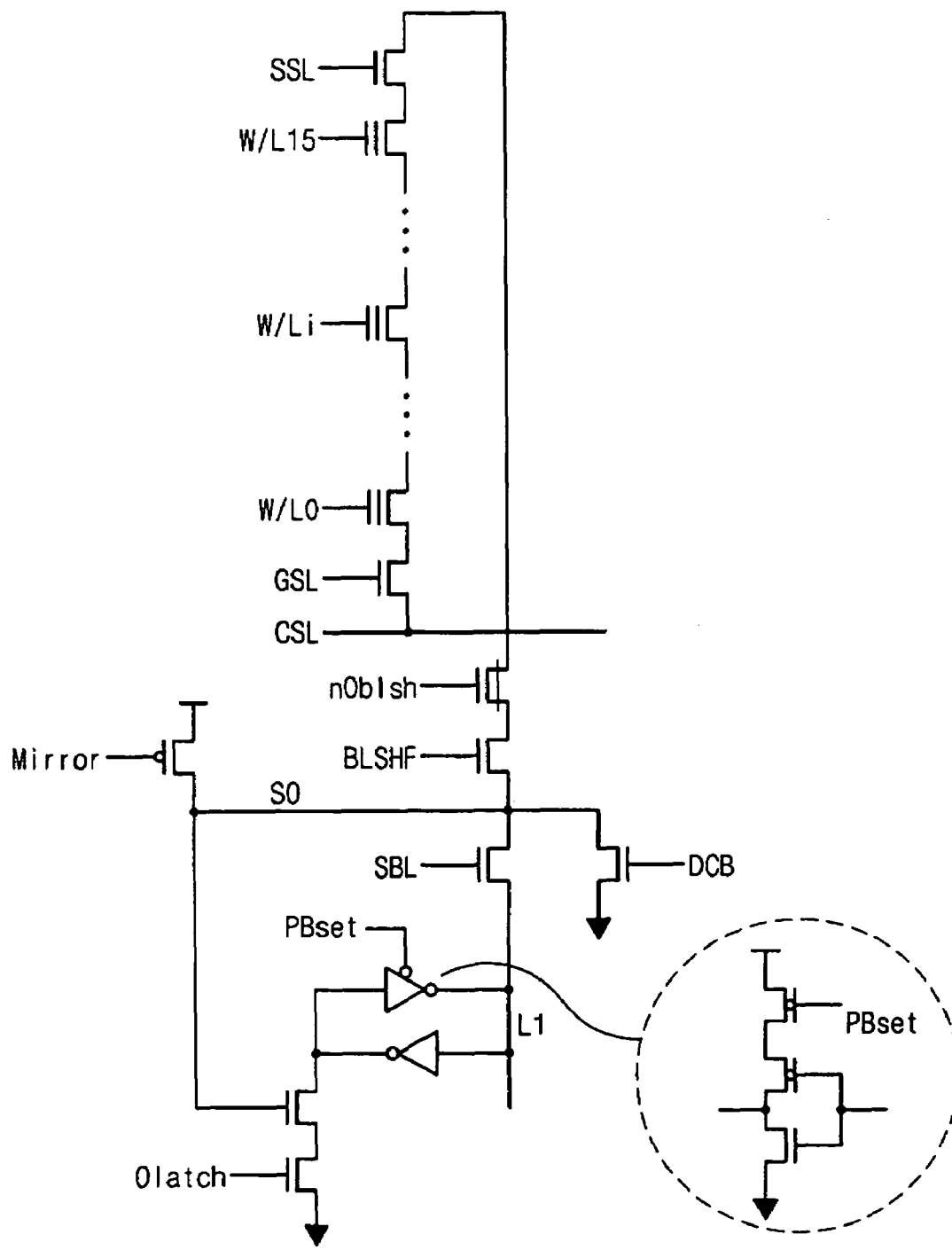
FIGS. 4a and 4b illustrate another example, related art page buffer and another example of a read operation of the example, related art page buffer.
Figure 4B:
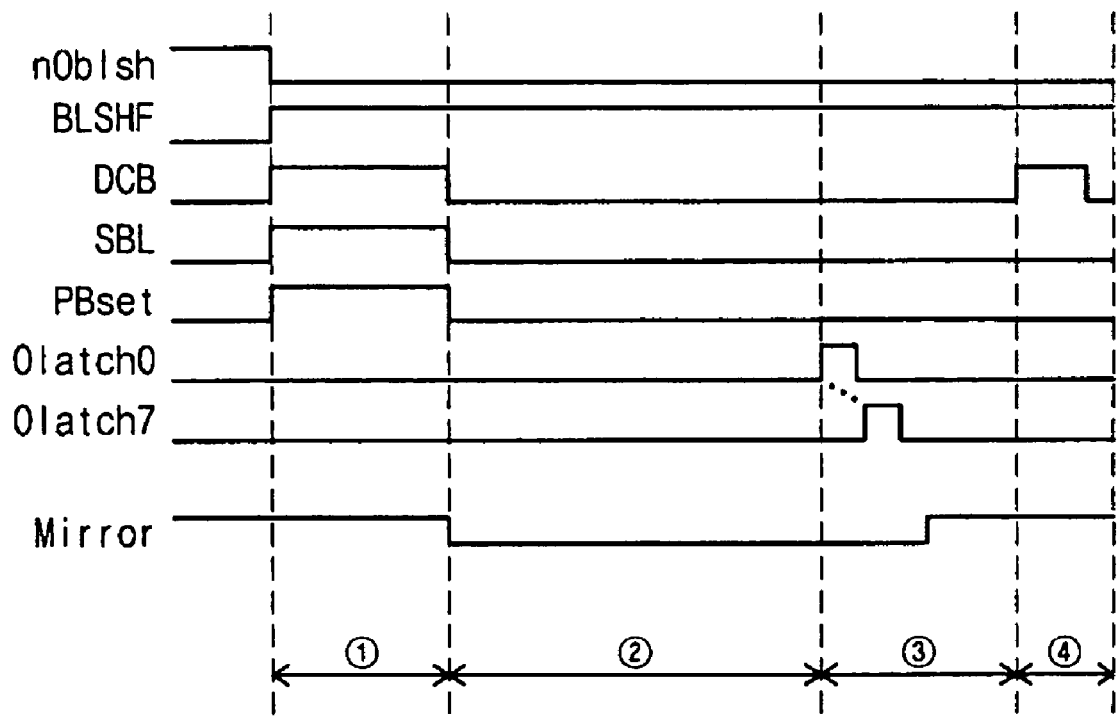
Figure 5A:
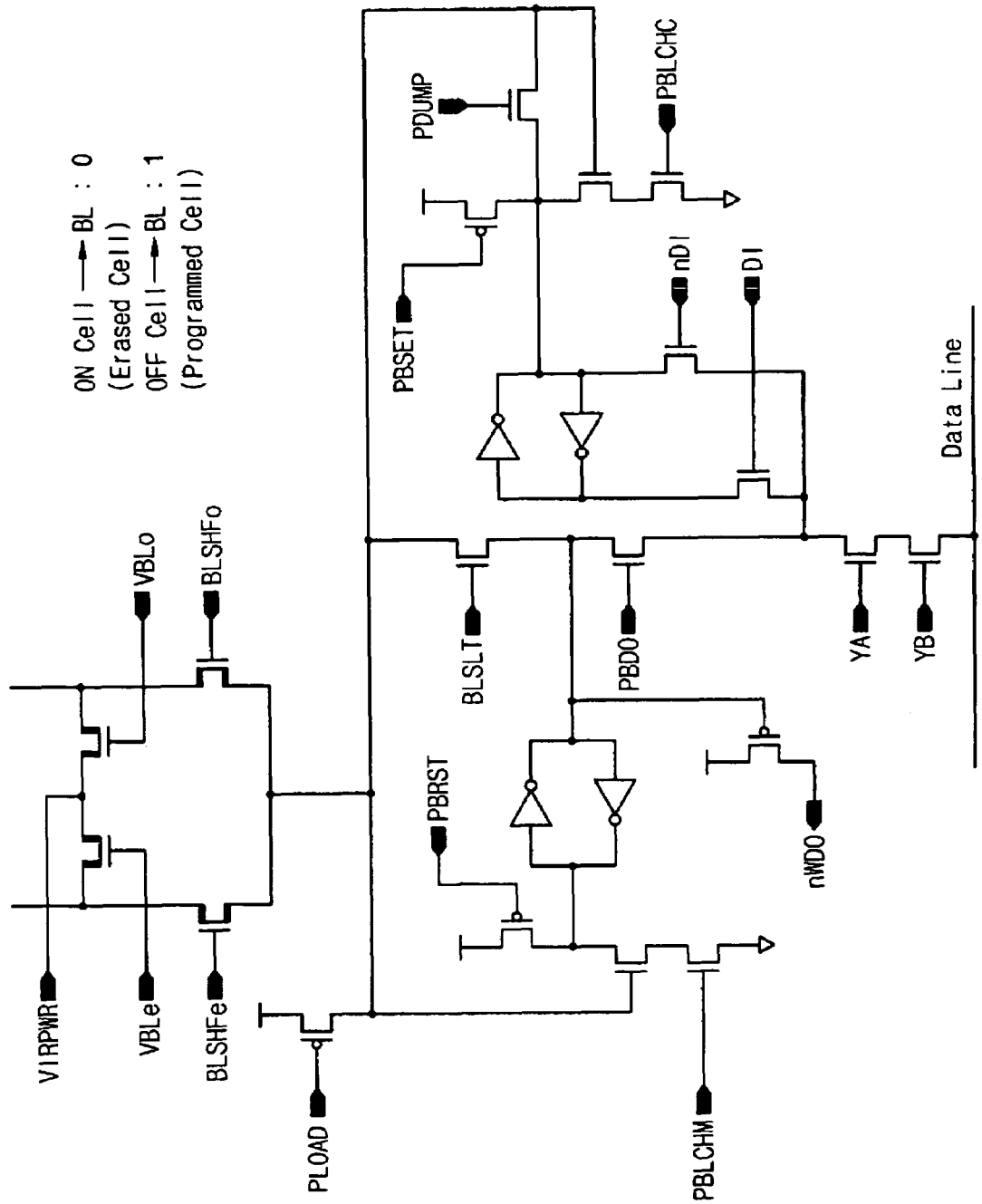
FIGS. 5a and 5b illustrate yet another example, related art page buffer and yet another example of a read operation of the example, related art page buffer.
Figure 5B:
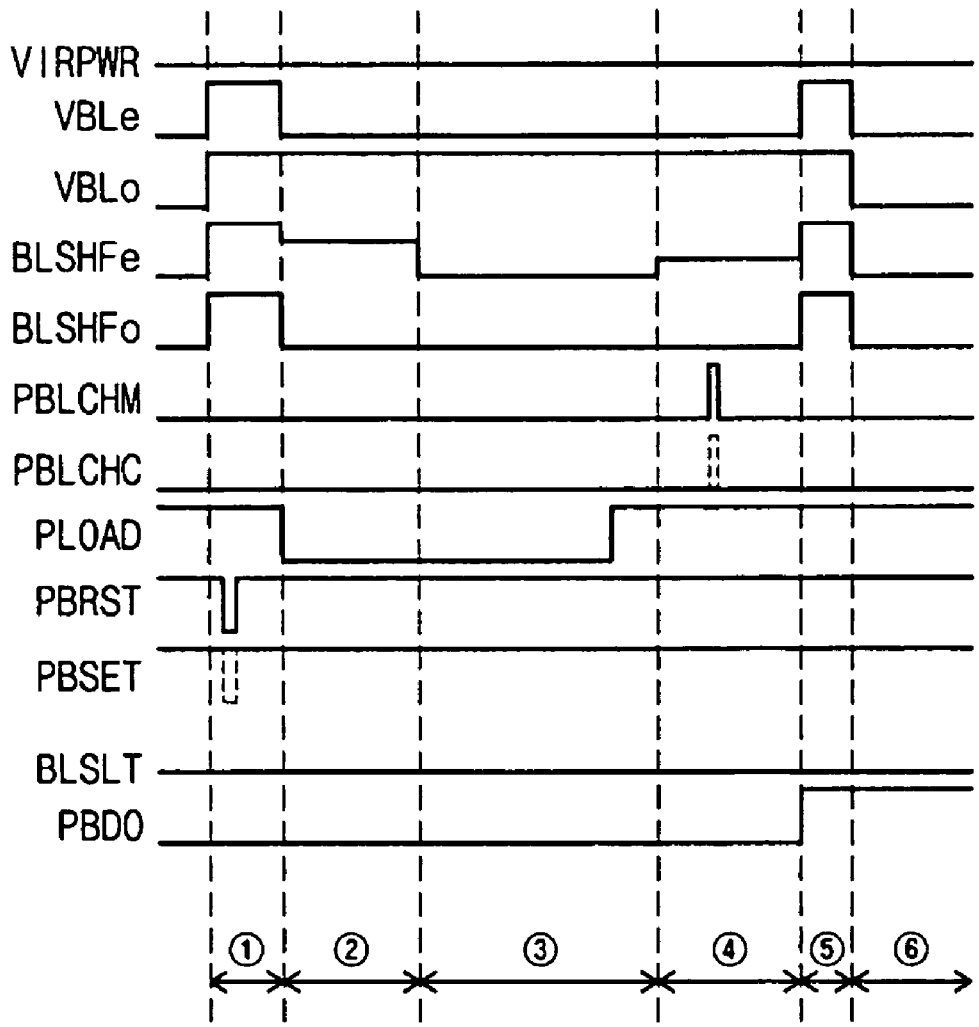
Figure 6:
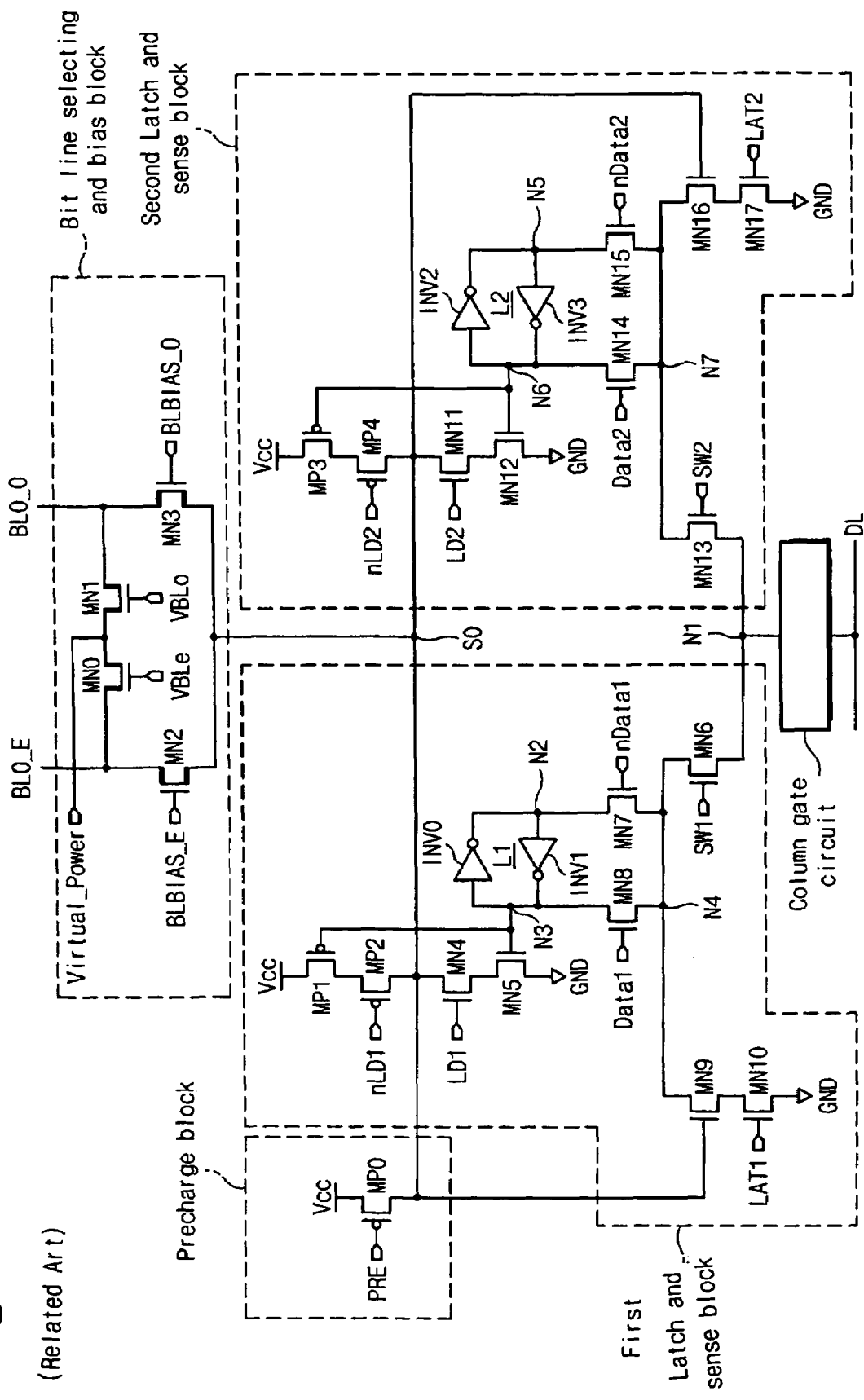
FIG. 6 illustrates the structure of an example, related art page buffer in more detail.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXAMPLE EMBODIMENTS OF THE PRESENT INVENTION

In example embodiments, the present invention is directed to a method and device for performing a cache operation, for example, a cache read operation.

In example embodiments, the present invention is directed to a method and device for reducing a data transfer time.

In example embodiments, the present invention is directed to a method and device for overlapping at least two of tR, tT, and tH to reduce a total transfer time where tR is a read operation time, tT is a buffer transfer time, and tH is a host transfer time.

In example embodiments, the present invention is directed to a method and device for transferring data where the data includes n pages of data (where n is an integer), and the total transfer time is less than n*(tR+tT+tH).

In example embodiments, the present invention is directed to a method and device for transferring data where the data includes n pages of data (where n is an integer), and the total transfer time is less than or equal to (n+1)*tR+tH.

In example embodiments, the present invention is directed to a method and device for transferring data where the data includes n pages of data (where n is an integer), and the total transfer time is less than or equal to (n*tR+2*tH).

In example embodiments, the present invention is directed to a method of reading data from a device, where the device is a semiconductor device.

In example embodiments, the present invention is directed to a method of cache reading data from a device, where the device is a semiconductor device.

In example embodiments, the semiconductor device may include a non-volatile memory cell array, page buffers, two or more buffers, and/or a controller.

In example embodiments, the semiconductor device may include a non-volatile memory cell array, page buffers, two or more buffers, and/or a controller may be formed on substrate to constitute a single chip.

In example embodiments, the non-volatile memory cell array may be flash memory, such as a one-NAND flash memory device.

In example embodiments, the page buffer may be a single latch page buffer.

In example embodiments, the two or more buffers may be random access memories (RAM), such as static random access memories (SRAM).

In example embodiments, the controller may be implemented in hardware, software, or a combination thereof.

Figure 7:
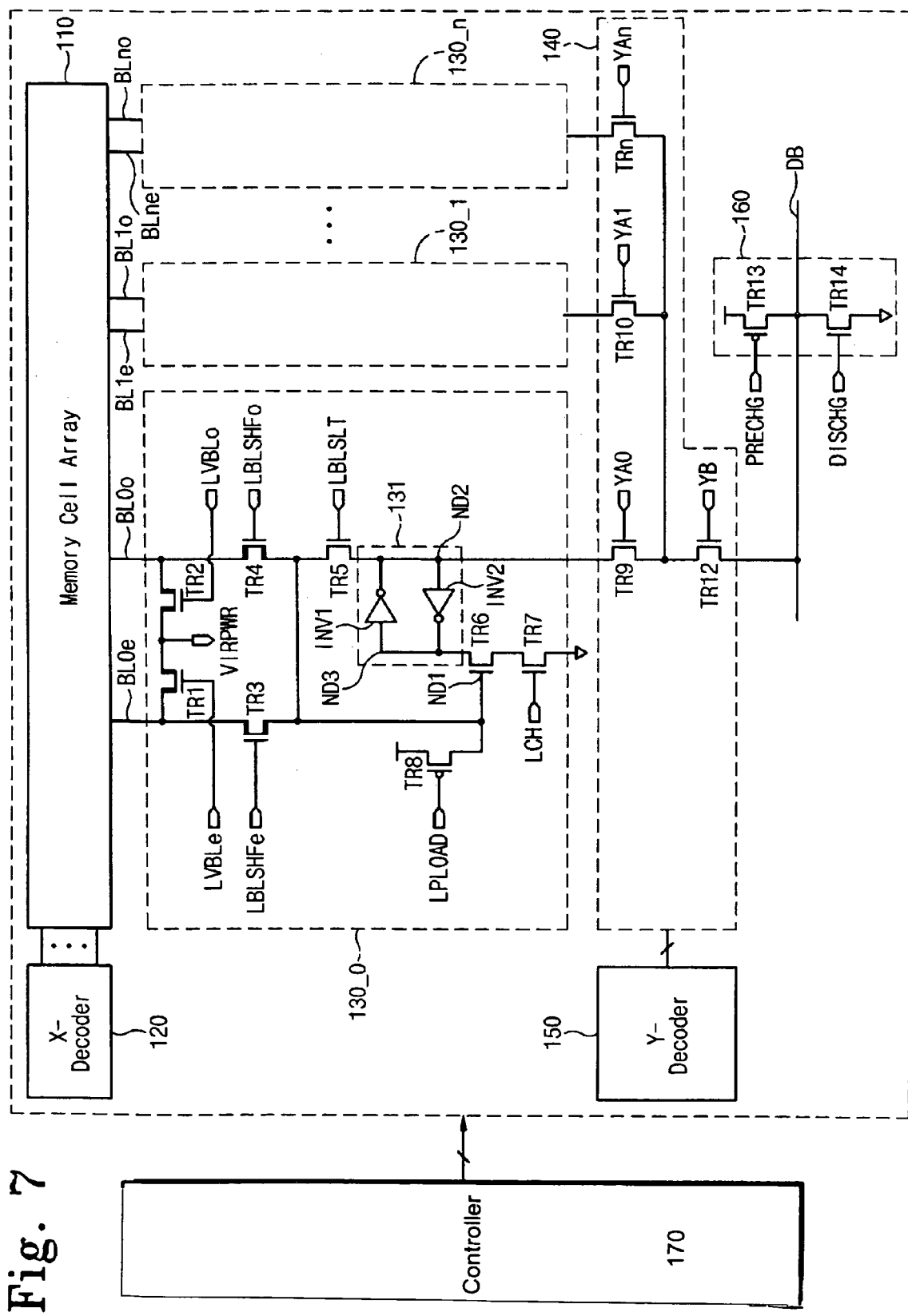
FIG. 7 illustrates a non-volatile memory device in accordance with an example embodiment of the present invention.

FIG. 7 illustrates a non-volatile memory device in accordance with an example embodiment of the present invention. Referring to FIG. 7, a nonvolatile memory device 100 of the present invention may include a memory cell array 110, which may further include a number of NAND strings, each connected to bit lines. In an example embodiment, the bit lines may be arranged in even/odd pairs, BL0e, and BL0o, BL1e and BL1o, . . . BLne and BLno, where n is an integer ≧2.

Page buffers 130_0-130_n may be connected to bit line pairs (BL0e, BL0o)-(BLne, BLno), respectively. The page buffer 130_0 (and/or each page buffer 130_n) may include a latch 131, NMOS transistors TR1-TR7, and a PMOS transistor TR8, which may be connected as shown in FIG. 7. The page buffer 130_0 (and/or each page buffer 130_n) may operate as a register which is used to store data to be programmed or data read out from the memory cell array 110.

The transistors TR1 and TR2 may be used to reset the bit lines BLie and BLio (i=0-n) in a bit line reset period of a read operation and/or to set unselected bit lines to a ground voltage in remaining periods thereof.

The transistors TR3 and TR4 may be used to electrically connect a selected bit line to a ND1 node and to electrically isolate an unselected bit line from the ND1 node. The PMOS transistor TR8 may be used to charge the ND1 node and the NMOS transistors TR6 and TR7 may be used to transfer a logic state of the ND1 node to the latch 131.

Page buffers 130_1-130_n may be configured the same as page buffer 130_0.

The nonvolatile memory device 100 may further include a column gate circuit 140, including NMOS transistors TR9 . . . TRn, and TR12, which may select a portion of one or more of the page buffers 130_0-130_n in response to select signals YA0-YAn and YB from a column decoder 150, and may electrically connect the selected page buffer(s) to a data bus DB. Although only one data line is shown in FIG. 7, it is apparent that the column gate circuit 140 may be configured to connect more data lines with page buffers 130_0-130_n.

The nonvolatile memory device 100 may further include a charge and discharge circuit 160, including PMOS transistor TR13 and NMOS transistor TR14, which may charge the data bus DB with a power supply voltage in response to a control signal PRECHG and may discharge the data bus DB to a ground voltage in response to a control signal DISCHG.

The nonvolatile memory device 100 may further include an X-decoder 120 and a Y-decoder for decoding rows (word line) and columns (bit line). Elements 110-160 may be controlled by a controller circuit 170, which will be more fully described below.

Figure 8:
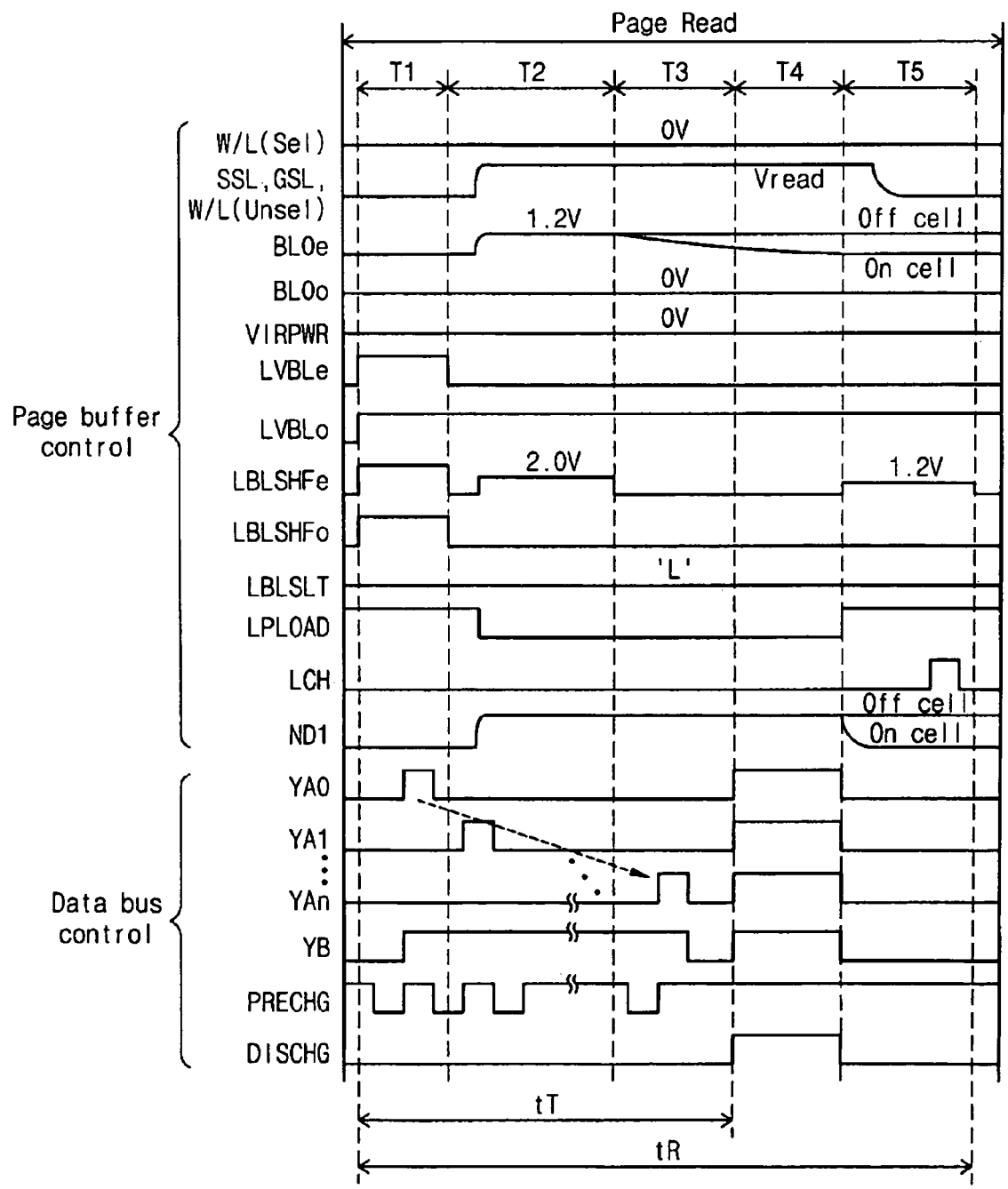
FIG. 8 is a timing diagram for describing a read operation of a nonvolatile memory device according to an example embodiment of the present invention.

FIG. 8 is a timing diagram for describing a read operation of a nonvolatile memory device according to an example embodiment of the present invention. FIG. 8 assumes that the bit line BL0e of bit lines BL0e and BL0o, connected to the page buffer 130_0, is selected and the bit line BL0o is unselected. The top portion of FIG. 8 illustrates control of page buffer 130_0 and the bottom portion of FIG. 8 illustrates control of data bus DB.

As shown in FIG. 8, a voltage of 0V may be applied to the selected bit line during a read operation (T1-T5), while a read voltage Vread may be applied to a string select line SSL, a ground select line GSL, and unselected word lines during periods T2-T4.

During a bit line reset period T1, control signals LVBLe, LVBLo, LBLSHFe, and LBLSHFO may be activated high and a control signal LPLOAD may be inactivated low. As the control signals LVBLe, LVBLo, LBLSHFe, and LBLSHFO are activated high, bit lines BL0e and BL0o may be electrically connected to a power line VIRPWR having a ground voltage (for example, 0V) during a read operation. Thus, the bit lines BL0e and BL0o may be reset to a ground voltage. In particular, a control signal LBLSLT may be maintained low during the bit line reset period T1, so that the latch 131 is not reset.

After resetting the bit line BL0e and BL0o, during a bit line pre-charge period T2, the selected bit line BL0e may be pre-charged with a given pre-charge voltage (for example, 1.2V).

As the control signals LVBLe and LBLSHFO go to a low level, the selected bit line BL0e may be electrically isolated from the power line VIRPWR, and an unselected bit line BL0o may be electrically isolated from the ND1 node. Because the control signal LVBLo may be maintained high during the bit line pre-charge period T2, the unselected bit line BL0o may be electrically connected to the power line VIRPWR having a ground voltage. At the same time, as the control signal LPLOAD is activated low, the PMOS transistor TR8 may be turned on. Current supplied from the turned-on transistor TR8 may be transferred to the selected bit line BL0e via the NMOS transistor TR3. At this time, since a voltage (for example, 2.0V) is supplied to the LBLSHFe line as illustrated in FIG. 8, the bit line BL0e may be pre-charged with a voltage of 2.0V-Vth, where Vth is a threshold voltage of transistor TR3.

During a bit line develop period T3, a voltage of the selected bit line BL0e may be maintained at the pre-charged voltage or lowered to a ground voltage depending on a state (i.e. a program state or an erase state) of a selected memory cell. At this time, the selected bit line BL0e may be floated. For example, as the control LBLSHFe goes to a low level of a ground voltage, the NMOS transistor TR3 may be turned off. This electrically isolates the selected bit line BL0e from the ND1 node. Under these conditions, if the selected memory cell has an erase state (or an on-cell), the pre-charged voltage of the selected bit line starts to be discharged to a ground voltage via the selected memory cell of the on state. On the other hand, if the selected memory cell has a program state (or an off-cell), the pre-charged voltage of the selected bit line is maintained.

In an example embodiment, the periods T1-T3 may constitute a period where cell data stored in a memory cell is set onto a bit line, which may be referred to hereinafter as a bit line set period and may be designated tT.

After the bit line set period T1-T3 (or tT) is completed, the latch 131 in the page buffer 130_0 may be reset/initialized during a latch reset period T4. Initialization of the latch 131 may be achieved by electrically connecting a ND2 node (or the latch 131) to the data bus DB via the column gate circuit 140. As shown in FIG. 8, select signals YA0-YAn and YB provided to the column gate circuit 140 may be activated high at the same time. At this time, a control signal DISCHG goes to a high level, so that the data bus DB is grounded. As a result, the ND2 node (or the latch 131) may be electrically connected to the data bus DB via the column gate circuit 140, with the data bus DB being grounded through the NMOS transistor TR14 of the charge and discharge circuit 160. Thus, the latch 131 is reset/initialized.

During a sense period T5, cell data reflected on the selected bit line BL0e may be stored in the latch 131. To achieve this, the control signal LPLOAD may be inactivated high and a voltage (for example 1.2V) may be applied to the LBLSHFe line. Under these conditions, if a memory cell in an erase state (or an on state) is connected to the selected bit line BL0e, a power supply voltage of the ND1 node may be discharged via the on cell.

On the other hand, if a memory cell in a program state (or an off state) is connected to the selected bit line BL0e, the power supply voltage of the ND1 node may be maintained. This is because the NMOS transistor TR3 (Vg=1.2, Vs=1.2V, Vd=Vcc) is shut off.

The NMOS transistor TR6 may be turned off in the former case, while it is turned on in the latter case. As a control signal LCH is pulsed, in the former case, an ND3 node of the latch 131 is grounded through NMOS transistors TR6 and TR7. In the latter case, the ND3 node is at an initialized state (e.g. a high) level.

With an example nonvolatile memory device of the present invention, during the bit line set period T1-T3, a set of data in the latches 131 of the page buffers 130_0-130_n may be transferred to the data bus DB through the column gate circuit 140. This may be accomplished, as illustrated in FIG. 8, by sequentially activating the select signals YA0-YAn, with the select signal being set to a high level. The data bus DB may be charged with a power supply voltage between activation periods of the select signals YA0-YAn, which is generated by activating the PMOS transistor TR13 of the charge and discharge circuit 160 every charge interval.

As is apparent from the above description, data previously stored in the page buffers 130_0-130_n may be transferred to the data bus DB while data stored in the cell is read out and stored in the latch (tR, T1~T5). Because page data stored in a page (row) of memory cells may be output externally during the bit line set period (T1-T3) of another page (or row), it is possible to reduce a time needed for a continuous read operation.

Figure 9:
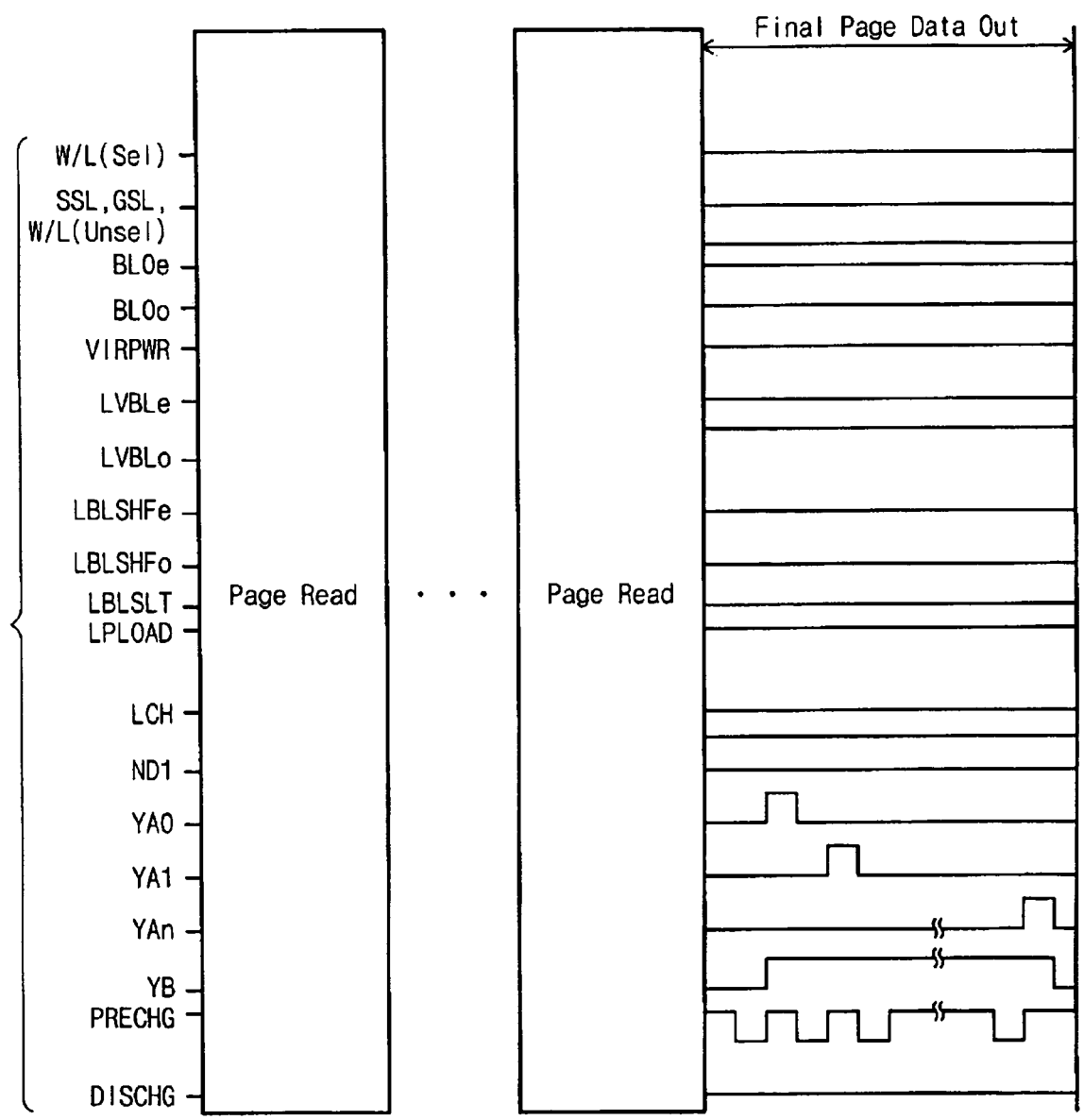
FIG. 9 illustrates a read operation in order to output data of a last selected page in accordance with an example embodiment of the present invention.

In an example embodiment, page data output during a first read operation may be garbage data, and page data output during a second read operation may be page data sensed during the first read operation. As shown in FIG. 9, when n pages are accessed, a read operation is performed once more in order to output data of an nth-selected page. During the last read operation, an operation for controlling the column gate circuit may only be made to transfer stored data in the page buffers 130_0-130_n to the data bus DB.

Figure 10:
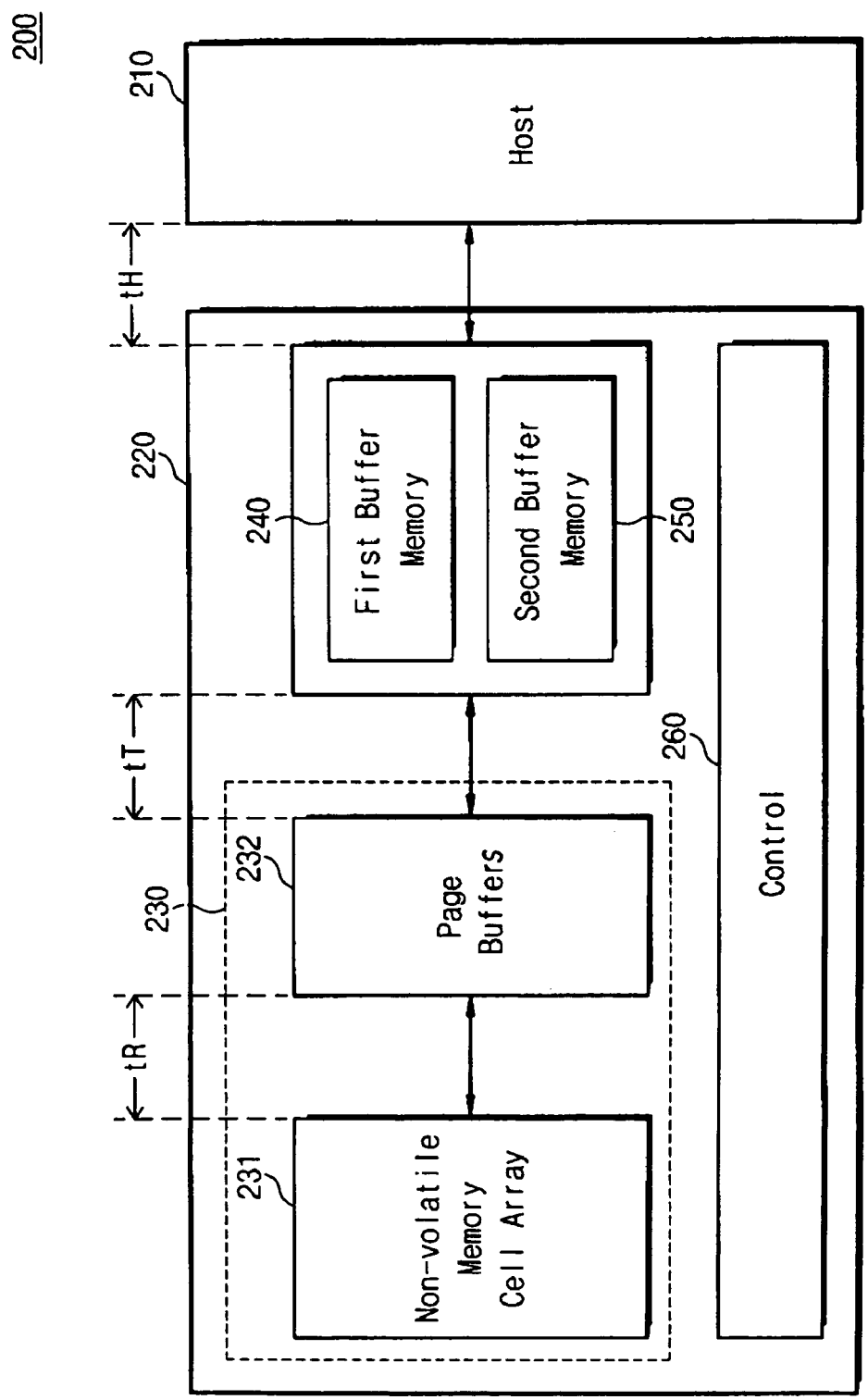
FIG. 10 illustrates a memory system in accordance with an example embodiment of the present invention.

FIG. 10 illustrates a memory system in accordance with an example embodiment of the present invention. As shown in FIG. 10, the memory system 200 may include a host 210 and a memory device 220. The memory device 220 may carry out a data read/write operation under control of the host 210 and may includes a nonvolatile memory 230, such as a nonvolatile memory core, a first buffer memory 240, a second buffer memory 250, and a controller 260. The nonvolatile memory 230 may further include a nonvolatile memory cell array 231 and page buffers 232, and may be controlled by the controller 260. The nonvolatile memory 230 may be the same as the nonvolatile memory device of FIG. 7. The host 210 may be a microprocessor unit (MPU), a central processing unit (CPU), a memory controller, or other processor or controller.

The first and second buffer memories 240 and 250 may be controlled by the controller 260 to individually perform read/write operations and may be used to store data from the nonvolatile memory 230 (or data to be stored in the nonvolatile memory 230). The nonvolatile memory 230 may operate the same as that the nonvolatile memory device of FIG. 7 under control of the controller 260.

As shown in FIG. 10, a read operation time tR may be defined as a time needed to transfer page data from the memory cell array 231 to the page buffer 232, a buffer transfer time tT may be defined as a time needed to transfer page data from the nonvolatile memory 230 (or from the page buffer 232) to a buffer memory 240, 250, and a host transfer time tH may be defined as a time needed to transfer page data from a buffer memory 240, 250 to the host 210.

Figure 11A:
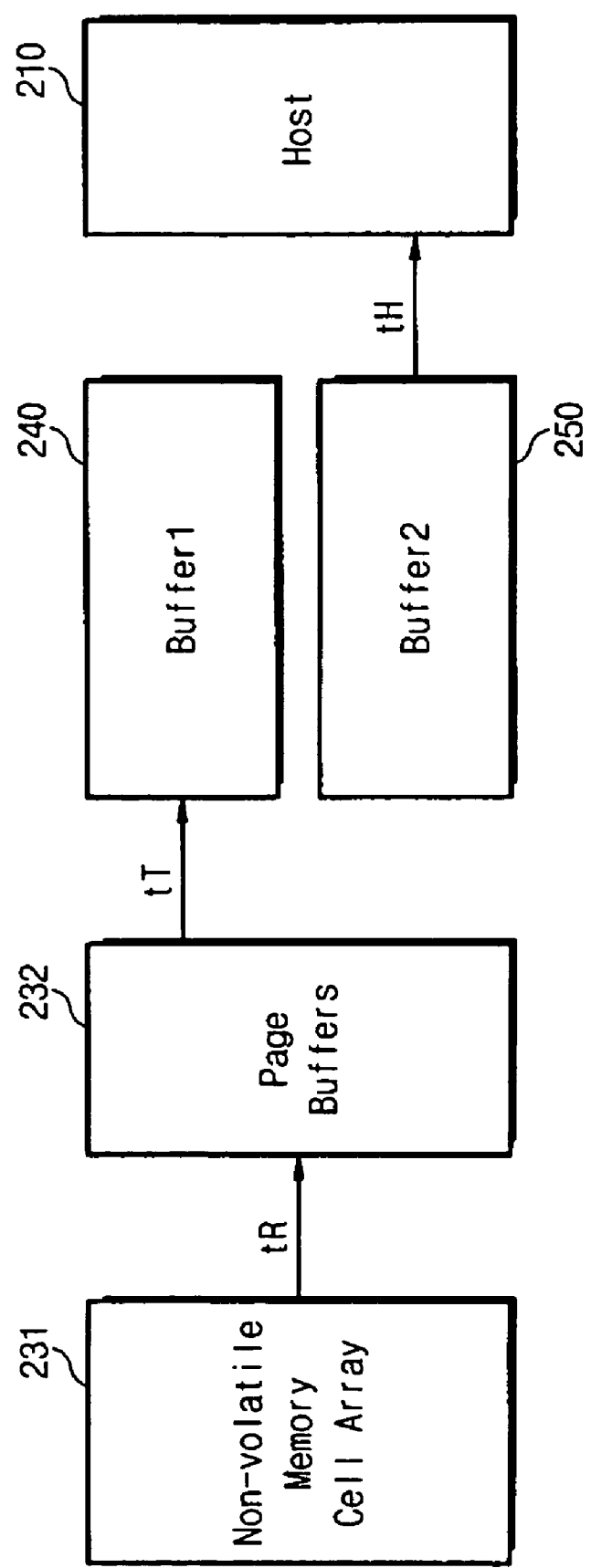
FIGS. 11a and 11b illustrate a cache read operation in accordance with an example embodiment of the present invention.
Figure 11B:
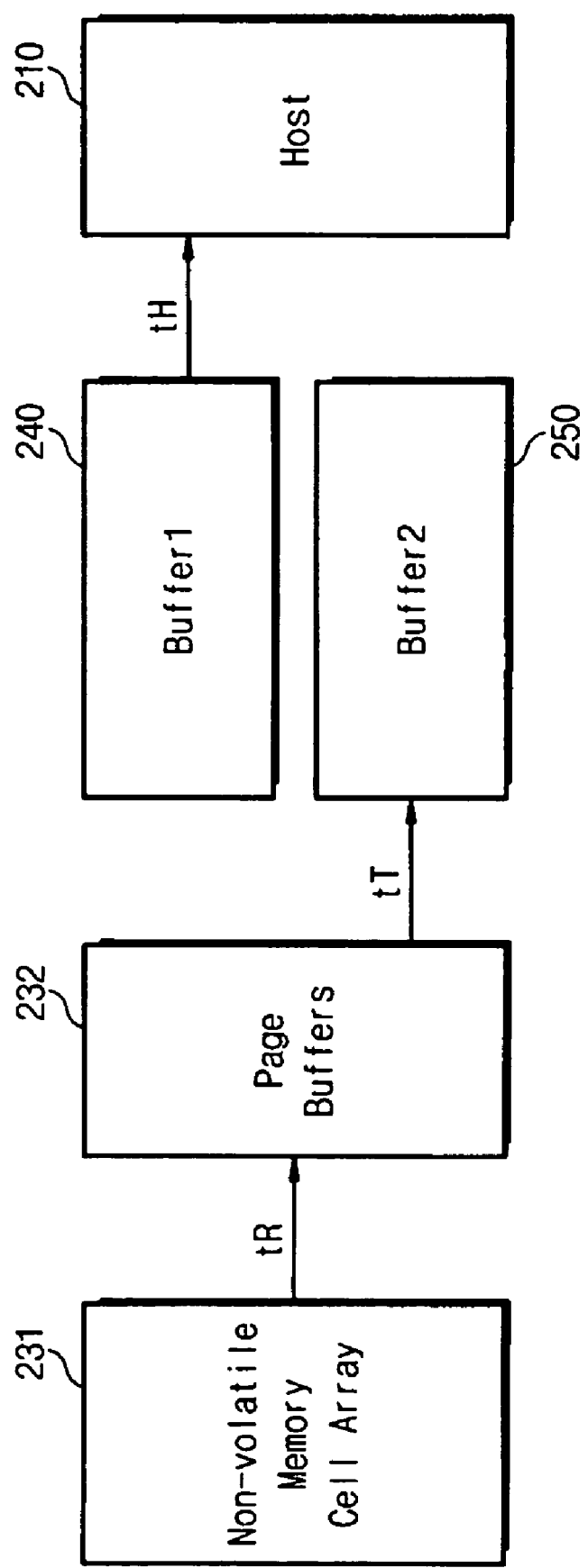

A cache read operation in accordance with an example embodiment of the present invention may be illustrated in conjunction with FIGS. 11a and 11b. As shown in FIG. 11a, page data may be transferred from the nonvolatile memory 230 to the first buffer memory 240 during a bit line set period T1-T3 (tT), and a previous page data may concurrently be transferred from the second buffer memory 250 to a host 210 during all periods T1-T5 of a read operation (tR) or during a buffer transfer time(tT).

As shown in FIG. 11b, page data may be transferred from the nonvolatile memory 230 to the second buffer memory 250 during the bit line set period T1-T3 (tT), and page buffer may be transferred from the first buffer memory 240 to the host 210 during all periods T1-T5 of a read operation (tR).

In the case of a continuous read operation, the host transfer time tH needed to transfer page data from a buffer memory 240, 250 to the host 210 may be hidden within the read operation time tR. Alternatively, the read operation time tR may be hidden within the host transfer time tH. This means that memory system performance may be improved.

Figure 12:
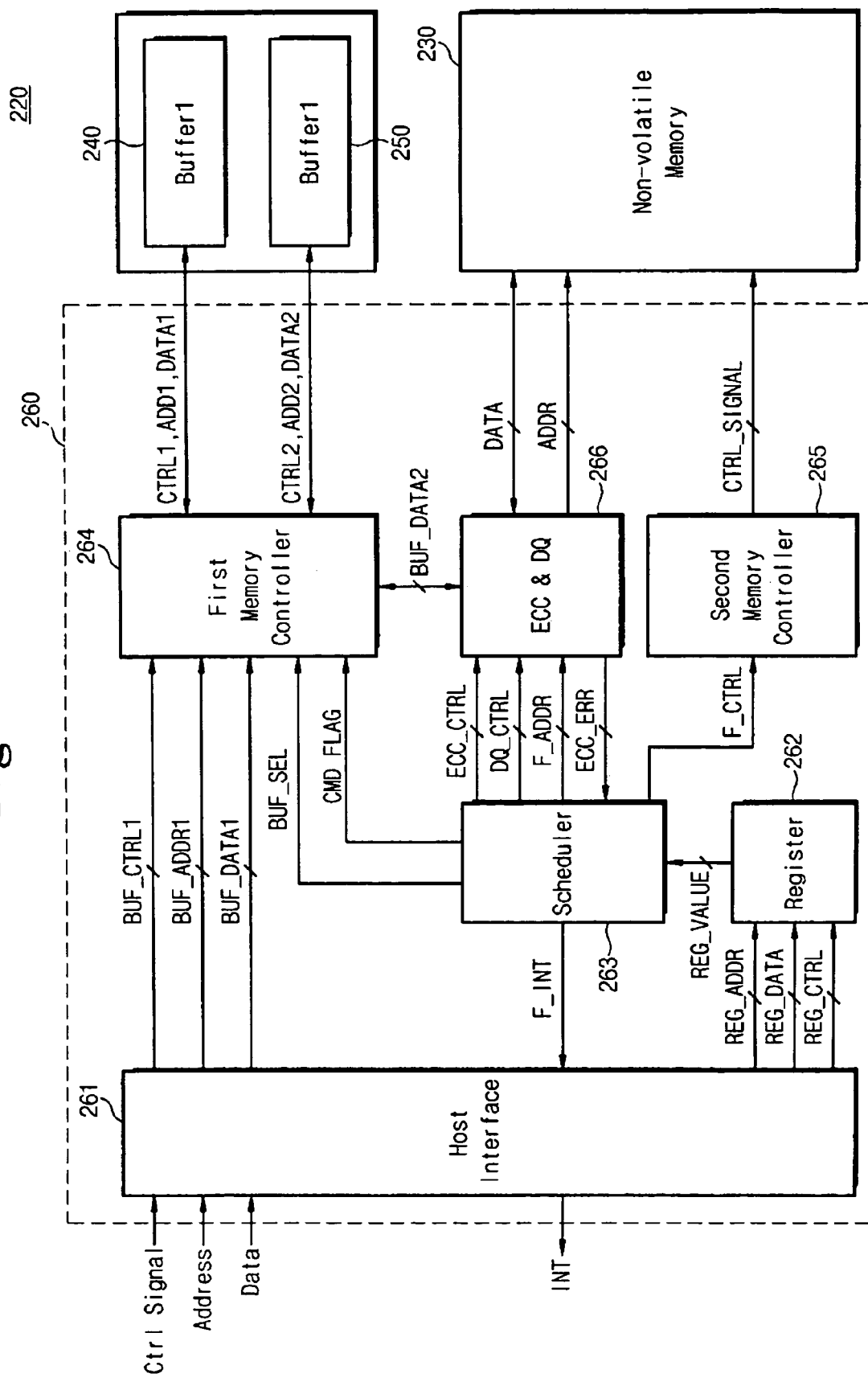
FIG. 12 illustrates a block diagram of a memory device in accordance with another example embodiment of the present invention.

FIG. 12 illustrates a block diagram of a memory device in accordance with another example embodiment of the present invention. Referring to FIG. 12, a memory device 220 in accordance with an example embodiment of the present invention may be controlled by the host 210 to store data from the host 210 or to output data stored therein to the host 210. The memory device 220 may include a controller 260, which may further include a host interface 261 for interfacing with the host 210. In accordance with an example embodiment of the present invention, the host interface 261 may be realized in various ways, for example, as an SRAM interface or a NOR interface.

In the case of transferring data from the nonvolatile memory 230 to the host 210, data may be read out from the nonvolatile memory 230, and the read-out data may be stored in either one of the first and second buffer memories 240 and 250. The memory device 220 may read out data in a buffer memory 240, 250 and may transfer the read-out data to the host 210. While data may be transferred to the host 210 from a buffer memory 240, 250, as described above, a read operation may be simultaneously performed in the nonvolatile memory 230, as is more fully described below.

In an example embodiment, the buffer memories 240, 250, for example, can be realized using SRAM or any other RAM.

In an example embodiment, the control block 260 may further include a register 262, a scheduler 263, a first memory controller 264, a second memory controller 265, and/or an error correction and data input/output part 266.

The register 262 may be used to store addresses and/or command data transferred from the host 210 via the host interface 261. For example, register data REG_DATA may be stored in a region of the register 262 corresponding to a register address REG_ADDR according to control signal REG_CTRL. Data stored in the register 262 may include buffer select information for selecting the first and second buffer memories 240 and 250, block and page addresses of the nonvolatile memory 230, a command, and/or device ID information, etc. These data values may be stored in register regions pointed to by register addresses REG_ADDR.

In an example embodiment, the scheduler 263 may be realized using a well-known state machine. For example, the scheduler 263 may control the first memory controller 264, the second memory controller 265, and/or the error correction (ECC) and data input/output part 266 based on a first cache read command, buffer select information, and/or address information stored in the register 262, which is described below.

In an example embodiment, the scheduler 263 may generate a flag signal F_INT, which may be output to the host 210 through the host interface 261 as an interrupt signal INT. The interrupt signal INT may be activated low when a command is loaded into the register 262 and inactivated high when a read operation of the nonvolatile memory 230 ends.

In an example embodiment, the host 210 may determine a point in time for storing data in the register 262 in response to a logic state of the interrupt signal INT. The first memory controller 264 may simultaneously control the first and second buffer memories 240 and 250 so that data is transferred from the nonvolatile memory 230 to a buffer memory and so that data is transferred from a buffer memory 240, 250 to the host 210.

In an example embodiment, the second memory controller 265 may control the nonvolatile memory 230 in response to each flag signal F_INT. In an example embodiment, the error correction and data input/output part 266 may corrects error in data transferred between the first memory controller 264 and the nonvolatile memory 230 under control of the scheduler 263. In an example embodiment, the error correction and data input/output part 266 may also output data and address information to the nonvolatile memory 230 through corresponding buses ADDR and DATA, respectively. In an example embodiment, an address (including block and page address information) transferred to the nonvolatile memory 230 may be stored in the register 262.

In an example embodiment, all constituent elements of a memory device, such as memory device 220, may be formed on a substrate so as to constitute a single chip. That is, in an example embodiment, the memory device of the present invention may be a single chip, also commonly referred to as a "one-NAND flash memory device". In a one-NAND flash memory device, a register, such as register 262, may be set and automatically perform a read/write operation based on the set values in the register. A one-NAND flash memory device need not use a command/address/data multiplexed I/O structure that may be utilized in a conventional flash memory device. For this reason, an address transfer path and a data transfer path may be separated outside and/or inside of the host interface 261.

In an example embodiment, a memory cell array of the nonvolatile memory, such as the memory cell array of the nonvolatile memory 230 may be divided into a number of memory blocks. Each memory block may further include a main field, where main data is stored, and a spare field, where spare data (e.g. parity information for error correction) is stored.

Figure 13A:
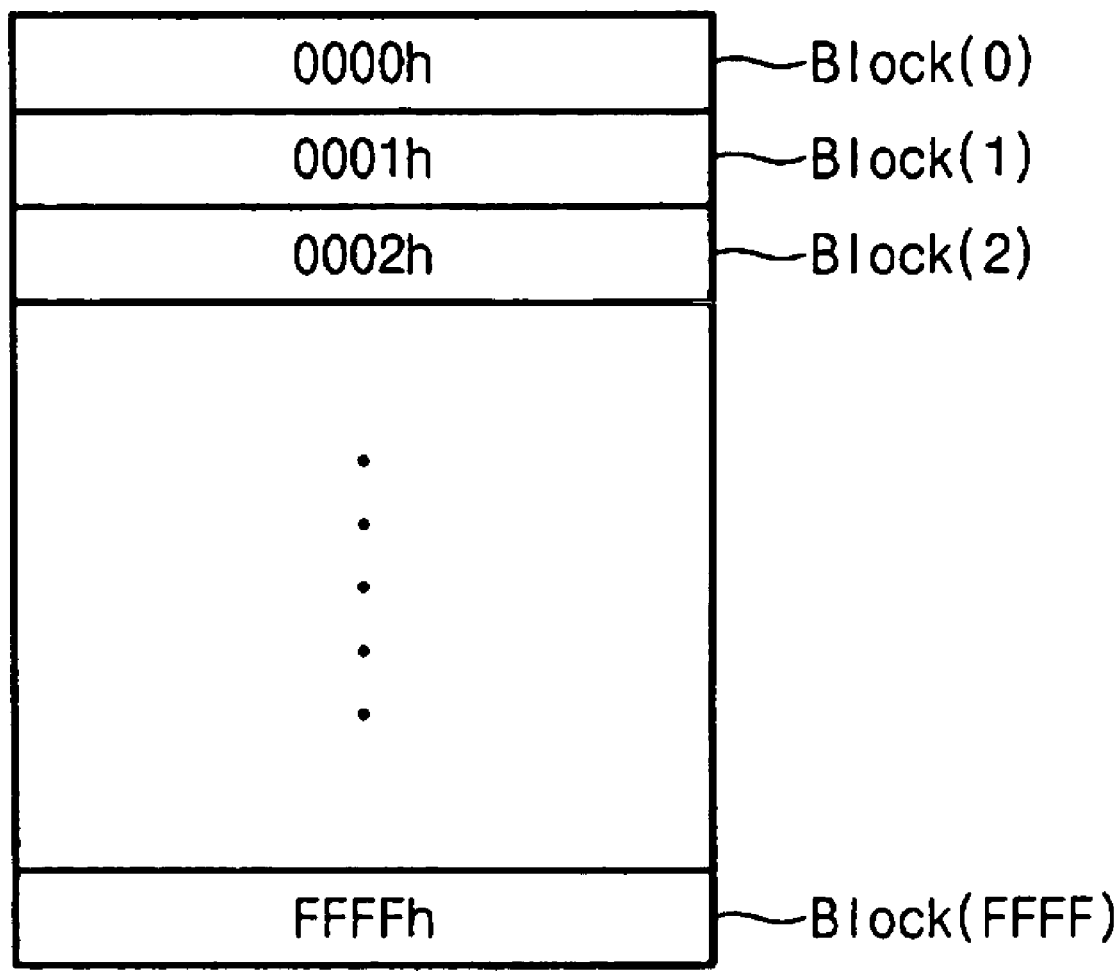
FIG. 13a illustrates memory blocks of a memory cell array of a semiconductor memory device according to an example embodiment of the present invention.
Figure 13B:
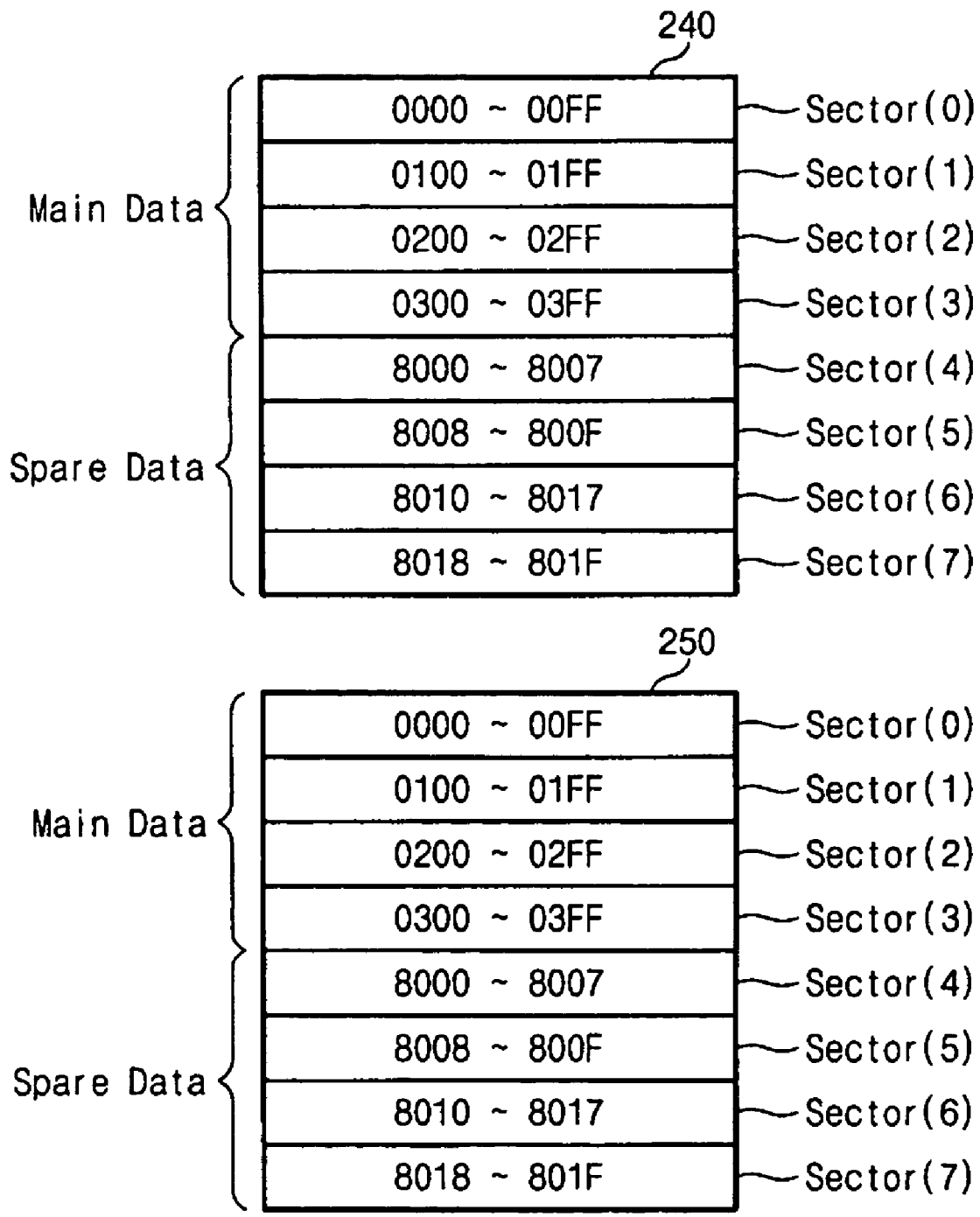
FIG. 13b illustrates sectors of a memory cell array of a semiconductor memory device according to an example embodiment of the present invention.

Memory blocks of the memory cell array may be selected by corresponding block addresses, respectively, as illustrated in FIG. 13a. Furthermore, the buffer memory 240, 250 may be divided into a main field, where the main data of the nonvolatile memory 230 is stored, and a spare field, where the spare data of the nonvolatile memory 230, is stored. As illustrated in FIG. 13b, each field may include a number of sectors that are selected by corresponding addresses.

For example, referring to FIG. 14a, an address region of F000h may be designated as a register region where device ID information (a maker of a memory device, a block size, a page size, etc.) is stored and may be a read-only region. Data, such as device ID information, in this register region F000h may be accessed by the host 210. An address region F001h may be designated as a register region where a flash block address is stored and an address region F002h may be designated as a register region where a flash page size is stored. An address region F003h may be designated as a register region where buffer select information for selecting buffer memories is stored and an address region F004h may be designated as a register region where a command is stored.

In an example embodiment, if data "0000h" is stored in the register region of F001h, a 0th memory block of a memory cell array in the nonvolatile memory core 230 may be selected. If data "0001h" is stored in the register region of F001h, a 1st memory block of the memory cell array in the nonvolatile memory core 230 may be selected. If data "0000h" is stored in the register region of F002h, a 0th page of a selected memory block may be selected. If "0002h" data is stored in the register region of F002h, a 2nd page of a selected memory block may be selected. If data "0000h" is stored in the register region of F003h, the first page buffer 240 may be selected. If data "0001h" is stored in the register region of F003h, the second page buffer 250 may be selected.

In an example embodiment, referring to FIG. 14b, when data "0000h" is stored in a register region of F004h, a read operation of the nonvolatile memory 230 may be carried out. In an example embodiment, when data "0001h" or "0002h" is stored in a register region of F004h, a cache read operation for the nonvolatile memory 230 may be carried out. As will be described below, if a cache read command of "0001h" is received, an operation for transferring data from page buffers to a buffer memory may be carried out together with an operation for setting cell data onto a bit line. On the other hand, if a cache read command of "0002h" is received, only the operation for transferring data from page buffers to a buffer memory may be carried out, without the operation for setting cell data onto a bit line.

In an example embodiment, the cache read command of "0001h" may be referred to as a first cache read command and the cache read command of "0002h" may be referred to as a second cache read command.

In an example embodiment, a write operation for the nonvolatile memory 230 may be carried out when data "0003h" is stored in a register region of F004h and an erase operation for the nonvolatile memory 230 may be carried out when data "0004h" is stored in the register region of F004h. A reset operation for the nonvolatile memory 230 may be carried out when data "0005h" is stored in the register region of F004h. FIGS. 14a and 14b illustrate the above-described command conditions.

Figure 15:
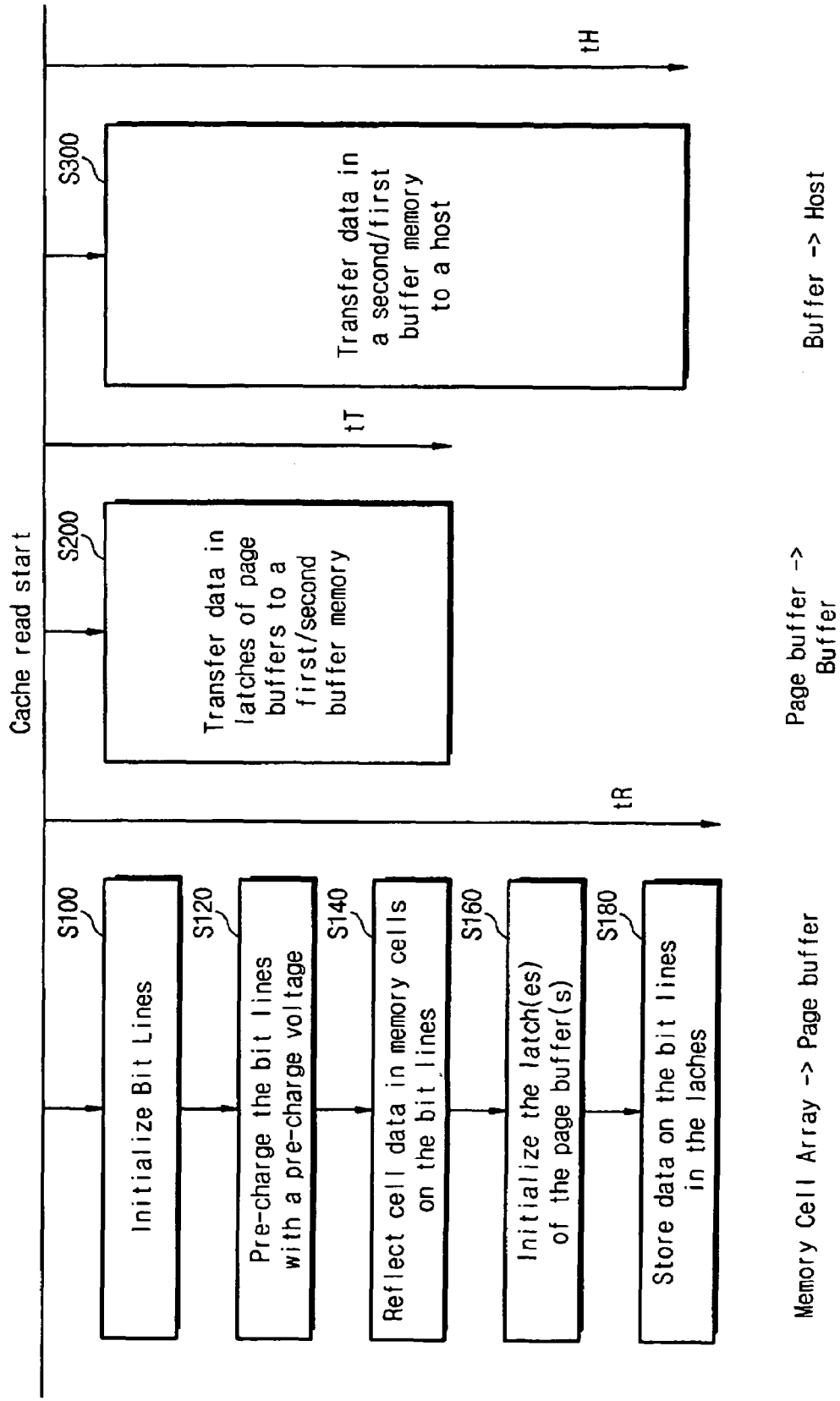
FIG. 15 illustrates an example flowchart for illustrating a cache read operation in accordance with an example embodiment of the present invention.

FIG. 15 illustrates an example flowchart for illustrating a cache read operation in accordance with an example embodiment of the present invention. As shown, data may be transferred from a memory cell array to page buffers during a data read time tR, which may include initializing bit lines (S100); pre-charging the bit lines with a pre-charge voltage (S120); making data values in memory cells reflected on the bit lines (S140); initializing latches in page buffers (S160); and storing data values on the bit lines in the latches (S180). S100, S120 and S140 may constitute a bit line set period, where data in a memory cell is reflected on a bit line.

Data may be transferred from page buffers to a buffer memory during a buffer transfer time tT (S200), which may be carried out during S100-S140 of the data read operation. While the data read operation is carried out, data may be transferred from a buffer memory to a host (S300), during a host transfer time tH. In an example embodiment, the data read time tR may be the longest of tR, tT and tH. For this reason, the times tT and/or tH may be hidden within the data read time tR.

Figure 16:
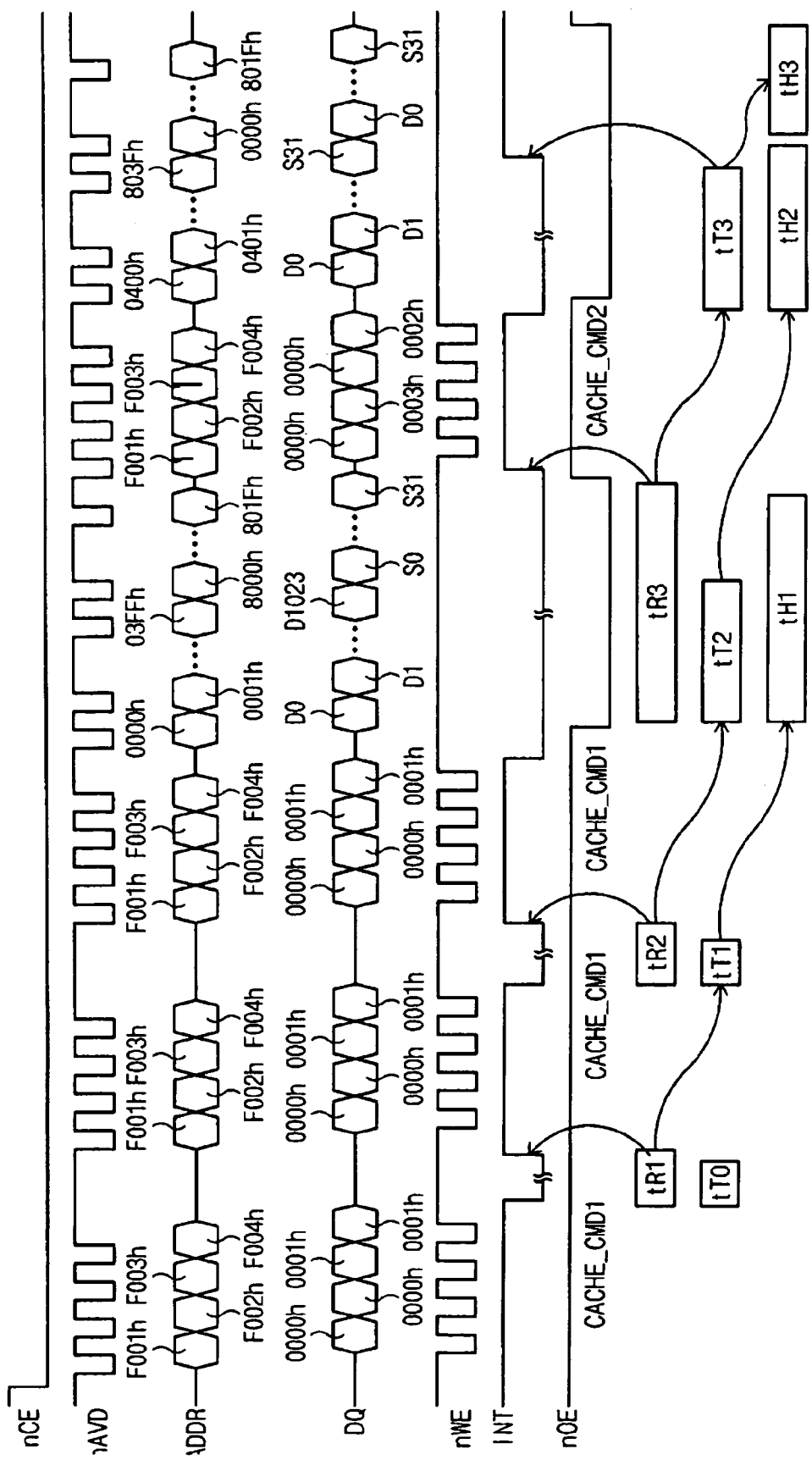
FIG. 16 illustrates an example timing diagram for performing a cache read operation in accordance with an example embodiment of the present invention.

FIG. 16 illustrates an example timing diagram for illustrating a cache read operation in accordance with an example embodiment of the present invention. As shown in FIG. 16, after an nCE (/Chip Enable) signal transitions from a high level to a low level, the host 210 may output data to be stored in the register 262 together with an address, to the memory device 220. The register 262 of the memory device 220 may receive an address REG_ADDR in response to a low-to-high transition of a control signal nAVD (/Address Valid Detect), and data REG_DATA may be stored in a register region of the received address in synchronization with a low-to-high transition of a control signal nWE.

For example, as illustrated in FIG. 16, in register region F001h may be stored data "0000h" and in register region F002h may be stored data "0000h". Data "0001h" may be stored in register region F003h and data "0001h" may be stored in register region F004h. These conditions may be sued to indicate a first cache read command is received, that a 0th page of a 0th memory block is selected, and that data of the selected page is stored in the second buffer memory 250. After the register 262 is set with the address and command data, the scheduler 262 may activate the interrupt signal INT low.

A memory block (e.g. 0th memory block) of memory blocks may be selected by a row decoder 120, and 0th page of pages in the selected memory block may be selected by the row decoder 120. Assuming that even-numbered bit lines BLie of bit line pairs BLie and BLio (i=0~n) are selected, after all bit lines BLie and BLio are reset to a ground voltage in the bit line reset period T1 (in FIG. 15, S100), the selected bit lines BLie may be pre-charged with a given pre-charge voltage in the bit line pre-charge period T2 (in FIG. 15, S120).

Cell data in memory cells of the selected page may be reflected on the selected bit lines BLie in the bit line develop period T3 (in FIG. 15, S140). After the bit line set period T1-T3, latches 131 of page buffers 130_0-130_n may be reset in the latch reset period T4 by electrically connecting the latches 131 to a data bus DB through a column gate circuit 140 (in FIG. 15, S160). Data values on the selected bit lines may be transferred to corresponding latches 131 in the sense period T5 (in FIG. 15, S180).

During the bit line set period T1-T3, data values stored in the latches 131 may be transferred to the data bus DB through the column gate circuit 140 and data values on the data bus DB may be transferred to the first memory controller 264 through the error correction and data input/output part 266.

Data values thus transferred may be stored in the second buffer memory 250 based on the control of the first memory controller 264 (in FIG. 15, S200). The first memory controller 264 may operate in response to a command flag signal CMD_FLAG and a buffer select signal BUF_SEL from the scheduler 264. The command flag signal CMD_FLAG may indicate a write command and the buffer select signal BUF_SEL may be set to select the first buffer memory 240 according to data in the register 262.

Once the first cache read command is received, a cache read operation may be automatically performed under the control of the scheduler 263. As described above, data values in the latches 131 during the bit line set period T1-T3 may be transferred to a selected buffer memory during the buffer transfer time tT0. If a read operation according to an input of the first cache read command is terminated or if the data read time tR1 elapses, the scheduler 263 may deactivate the interrupt signal INT high. The host 210 may respond to a low-to-high transition of the interrupt signal INT and may output addresses and/or command data needed for a next cache read operation. An operation of the memory device according to the next cache read command may be the same as described above, and description thereof is thus omitted.

As shown in FIG. 16, after the first cache command CACHE_CMD1 is received, during the data read time tR1, page data (including main data and spare data) may be transferred from a nonvolatile memory 230 to the second buffer memory 250 (e.g. SRAM) (tT0). Since the first transferred page data may be invalid data, the host 210 need not access the second buffer memory 250. If the first cache read command is again received, during the data read time tR2 (in particular, the bit line set period T1-T3), valid page data read out first (in FIG. 16, data read out during tR1) may be transferred to the first buffer memory 240 (tT1).

When the first cache read command CACHE_CMD1 is again received after the data read time tR, data in the first buffer memory 240 may be transferred to the host 210 according to host's requirement (tH1). At the same time, during the data read time tR3 (in particular, the bit line set period T1-T3), valid page data read out second (in FIG. 16, data read out during tR2) may be transferred to the second buffer memory 250 (tT2).

When the first cache read command CACHE_CMD1 is again received after the data read time tR, data in the second buffer memory 250 may be transferred to the host 210 through the first memory controller 264 according to host's requirement (tH2). At the same time, during the data read time tR4 (in particular, the bit line set period T1-T3), valid page data read out third (in FIG. 16, data read out during tR3) may be transferred to the first buffer memory 240 (tT3).

If the second cache read command CACHE_CMD2 is received after the data read time tR, an actual data sense operation may not be performed, while valid page data read out fourth (in FIG. 16, data read out during tR4) may be transferred to the second buffer memory 250 during the buffer transfer time tT4. At the same time, data in the first buffer memory 240 may be transferred to the host 210 through the first memory controller 264 according to host's requirement (tH3). If the last read-out page data (in FIG. 16, page data read out during tR4) is transferred to the second buffer memory 250, the scheduler 263 may deactivate the interrupt signal INT high. The host 210 may fetch page data stored in the second buffer memory 250 after the buffer transfer time tT4 (tH4).

Figure 17:
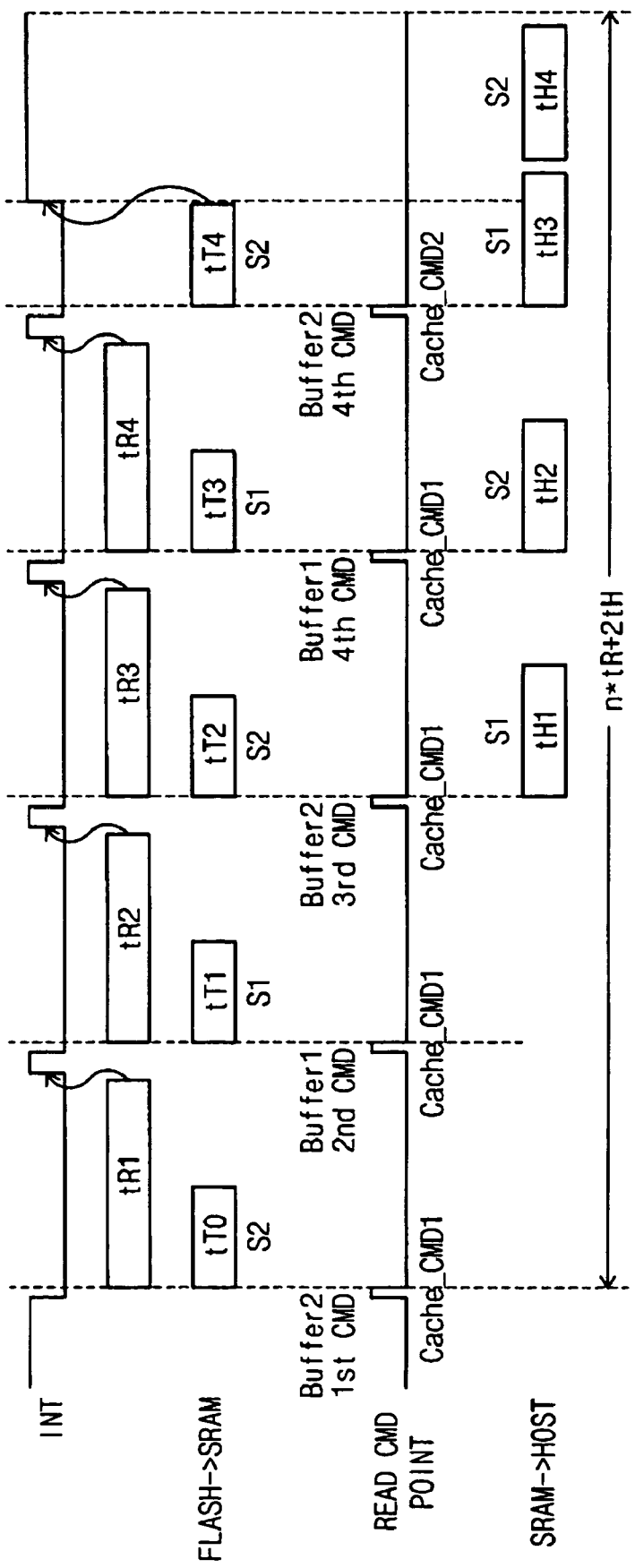
FIG. 17 illustrates an example timing diagram for performing a cache read operation using two first cache read commands in accordance with an example embodiment of the present invention.

As shown in FIG. 17, the interrupt signal INT may be deactivated after the first cache read command is received and then a data read time tR elapses. The host 210 may store the first/second cache read command in the register 262 in response to the inactivated interrupt signal INT.

In a memory system using a cache read operation and a dual buffering scheme in accordance with an example embodiment of the present invention, it may take a time of (n*tR+2tH), where n is an integer $\geq 2$, to transfer n-pages of data. In a memory system that does not use the cache read operation and the dual buffering scheme, it takes a time of n*(tR+tT+tH) to transfer n-pages of data. Accordingly, it is possible to reduce an overall read time by using an example embodiment of the present invention, so that memory system performance may be improved.

Figure 18:
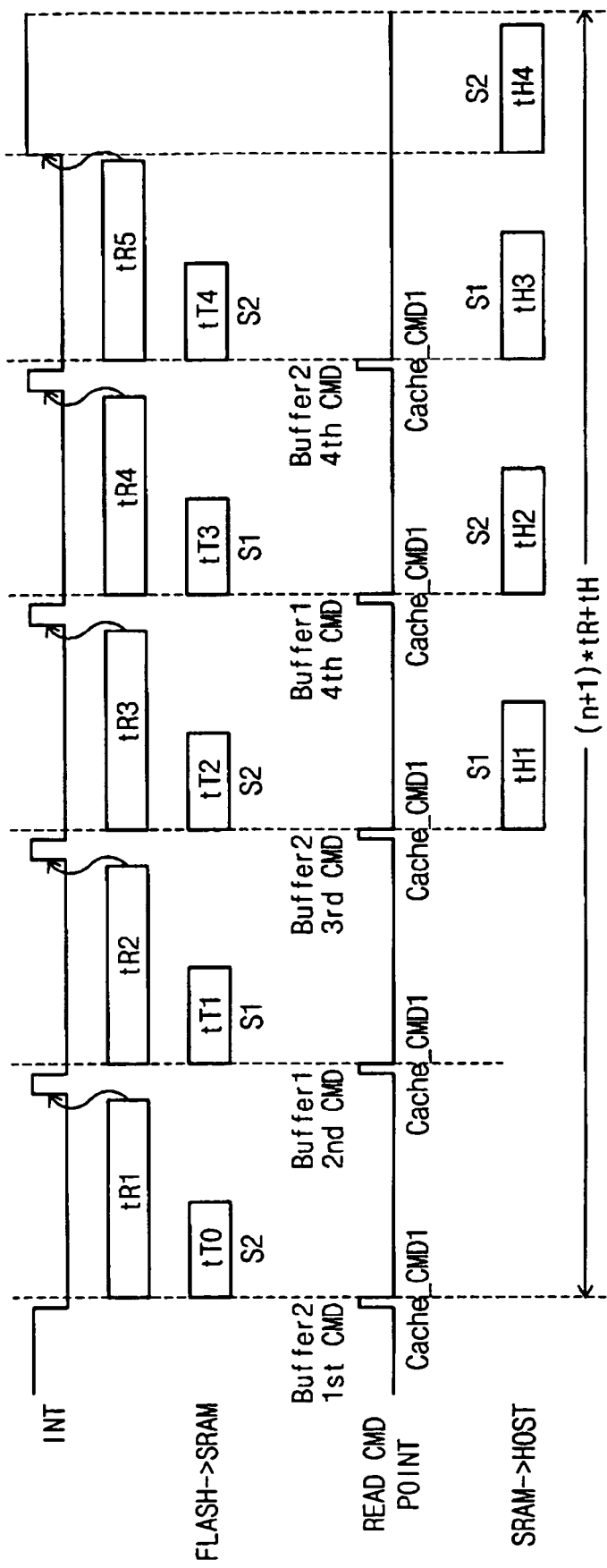
FIG. 18 illustrates an example timing diagram for performing a cache read operation using only a first cache read command in accordance with an example embodiment of the present invention.

In another example embodiment, it is also possible to perform a cache read operation using only the first cache read command CACHE_CMD1 instead of using the first and second cache read commands CACHE_CMD1 and CACHE_CMD2. For example, the timing diagram of FIG. 18 is the same as FIG. 17, except that a fifth input command is also the first cache read command CACHE_CMD1. Since the last command is the first cache read command CACHE_CMD1, an actual data sense operation may be performed during tR5. Valid page data read out during the tR5 time may be transferred to the second buffer memory 250. At the same time, data in the first buffer memory 240 may be transferred to the host 210 through the first memory controller 264 according to host's requirement (tH). After the first cache read command CACHE_CMD1 is received and the data read time tR5 elapses, the scheduler 263 may deactivate the interrupt signal INT high. Afterward, the host 210 may fetch page data stored in the second buffer memory 250 (tH4).

In the timing diagram in FIG. 18, it may take a time of ((n+1)*tR+tH) to transfer n-pages of data. Accordingly, it is possible to reduce an overall read time by using another example embodiment of the present invention, so that memory system performance may be improved.

Example embodiments of the present invention may be semiconductor devices. Example embodiments of the present invention may be non-volatile memory. Example embodiments of the present invention may be flash memory. Example embodiments of the present invention may be NAND or NOR flash memory. Example embodiments of the present invention may be one-NAND flash memory. Example embodiments of the present invention are applicable to single level cells (SLC) and/or multilevel cells (MLC). Example embodiments of the present invention are applicable to mass storage applications and/or code memory applications.

Example embodiments of the present invention refer to a method and device for overlapping at least two of tR, tT, and tH to reduce a total transfer time.

Example embodiments of the present invention refer to a cache read, but other operations may be cached as would be known to one of ordinary skill in the art.

Example embodiments of the present invention utilize one page buffer, but other numbers may be utilized as would be known to one of ordinary skill in the art.

Example embodiments of the present invention utilize two buffers, but other numbers may be utilized as would be known to one of ordinary skill in the art.

Example embodiments of the present invention utilize one or two cache read commands, but other numbers may be utilized as would be known to one of ordinary skill in the art.

Although example embodiments of the present invention have been described with respect to example voltages and example durations, it will be understood by one of ordinary skill in the art that each of these voltages may be varied (including the values mentioned in conjunction with the related art), without departing from the scope and spirit of the invention.

Although example embodiments of the present invention have been described with respect to certain voltages, each of these voltages may be also varied or fixed in value as would be known to one of ordinary skill in the art.

Although example embodiments of the present invention have been described as using a logic states 'low' and 'high', it will be understood by one of ordinary skill in the art that these logic states are interchangeable, without departing from the scope and spirit of the invention.

Although example embodiments of the present invention have been described as including NMOS and PMOS transistors, it will be understood by one of ordinary skill in the art that any other circuit implementation may be used, without departing from the scope and spirit of the invention.

It will be apparent to those skilled in the art that other changes and modifications may be made in the above-described example embodiments without departing from the scope of the invention herein, and it is intended that all matter contained in the above description shall be interpreted in an illustrative and not a limiting sense.

We claim:

1. A method of reading data from a semiconductor device, comprising:
   transferring first data from a non-volatile memory cell array into page buffers;

concurrently transferring the first data from the page buffers into a first of a pair of buffers and transferring second data from the non-volatile memory cell array into the page buffers; and concurrently transferring the first data from the first of the pair of buffers to a host, transferring the second data from the page buffers into a second of the pair of buffers, and transferring third data from the non-volatile memory cell array into the page buffers; wherein a time to transfer page data from the page buffers to one of the pair of buffers and a time to transfer page data from one of the pair of buffers to the host are hidden in a time to page data from the non-volatile memory cell array to the page buffers.

2. The method of claim 1, wherein the first data, the second data, and the third data are page data.

3. The method of claim 1, wherein the transfer between the non-volatile memory cell array and the page buffers occurs in page increments.

4. The method of claim 1, wherein the transfer between the page buffers and the pair of buffers may occur in page increments.

5. The method of claim 1, wherein transferring of the first data from page buffers to a pair of buffers occurs concurrently with discharging bit lines related to the second data of the memory cell array.

6. The method of claim 1, further comprising:
repeating the reading, concurrent transferring from the page buffers into one of the pair of buffers, and concurrent transferring from the other of the pair of buffers to the host for each of M pages (where M is an integer >2).

7. The method of claim 6, wherein the reading of the M pages of data from the page buffers to one of the pair of buffers includes transferring the data from the page buffers to one of the pair of buffers and setting cell data onto bit lines of the non-volatile memory cells.

8. The method of claim 6, wherein the reading of data from the page buffers to one of the pair of buffers in initiated by a first cache read command.

9. The method of claim 6, wherein the reading of the M pages of data from the page buffers to one of the pair of buffers includes transferring the Mth page of data from the page buffers to one of the pair of buffers and transferring each of the (M−1)th page of data from one of the page buffers to the other of the pair of buffers and setting cell data onto a bit line of the non-volatile memory cell.

10. The method of claim 1, wherein a time to transfer page data from the non-volatile memory cell array to the page buffers is longer than a time to transfer page data from the page buffers to one of the pair of buffers and a time to transfer page data from one of the pair of buffers to the host.

11. A semiconductor device, comprising:
a non-volatile memory cell array for storing data;
a plurality of page buffers;
a pair of buffers; and
a controller for controlling the non-volatile memory cell array, the page buffers, and the pair of buffers to transfer first data from a non-volatile memory cell array into the page buffers, concurrently transfer the first data from the page buffers into a first of a pair of buffers and read second data from the non-volatile memory cell array into the page buffers, and concurrently transfer the first data from a first of a pair of buffers to a host, transfer the second data from the page buffers into a second of the pair of buffers, and read third data from the non-volatile memory cell array into the page buffers; wherein a time to transfer page data from the page buffers to one of the pair of buffers and a time to transfer page data from one of the pair of buffers to the host are hidden in a time to transfer page data from the non-volatile memory cell array to the page buffers.

12. The semiconductor device of claim 11, wherein the page buffers are a single latch type page buffers.

13. The semiconductor device of claim 11, said controller controlling the non-volatile memory cell array, the page buffers, and the pair of buffers such that each of M pages (where M is an integer >2) is transferred to the host.

14. The semiconductor device of claim 13, wherein the reading of the M pages of data from the page buffers to one of the pair of buffers includes transferring the Mth page of data from the page buffers to one of the pair of pair of buffers and setting cell data onto a bit line of the non-volatile memory cell.

15. The semiconductor device of claim 14, wherein the reading of the M pages of data from the page buffers to one of the pair of buffers in initiated by a first cache read command.

16. The semiconductor device of claim 11, wherein a time to transfer page data from the non-volatile memory cell array to the page buffers is longer than a time to transfer page data from the page buffers to one of the pair of buffers and a time to transfer page data from one of the pair of buffers to the host.

17. The semiconductor device of claim 11, wherein the pair of buffers are random access memories (RAM).

18. The semiconductor device of claim 17, wherein the pair of buffers are static random access memories (SRAM).

19. The semiconductor device of claim 11, wherein the non-volatile memory cell array, page buffers, the pair of buffers, and the controller are formed on substrate to constitute a single chip.

20. The semiconductor device of claim 11, wherein the semiconductor device is a one-NAND flash memory device.

21. The semiconductor device of claim 11, wherein the non-volatile memory cell array includes a plurality of memory blocks.

22. The semiconductor device of claim 20, wherein each memory block includes a main field and a spare field.

23. The semiconductor device of claim 11, wherein each of the pair of buffers includes a plurality of sectors, a first number of sectors constituting a main field and a second number of sectors constituting a spare field.

24. A method of cache reading data from a semiconductor device, comprising:
concurrently transferring first data from a first buffer to a host, transferring second data from page buffers into a second buffer, and reading third data from a non-volatile memory cell array into the page buffers; wherein a time to transfer a page from the page buffers to one of the first and second buffers and a time to transfer a page from one of the first and second buffers to the host are hidden in a time to transfer a page from the non-volatile memory cell array to the page buffers.

25. The method of claim 24, further comprising:
repeating the concurrent transferring and reading for each of M pages (where M is an integer >2).

26. The method of claim 25, wherein the cache reading of the M pages of data from the page buffers to one of the first and second buffers includes transferring the Mth page of data from the page buffers to one of the first and second buffers and setting cell data onto a bit line of the non-volatile memory cell.

27. The method of claim 26, wherein the cache reading of the M pages of data from the page buffers to one of the first and second buffers in initiated by a first cache read command.

28. The method of claim 24, wherein a time to transfer a page from the non-volatile memory cell array to the page buffers is longer than a time to transfer a page from the page buffers to one of the first and second buffers and a time to transfer a page from one of the first and second buffers to the host.

* * * * *